United States Patent [19]

Inoue et al.

[11] Patent Number: 5,905,384
[45] Date of Patent: May 18, 1999

[54] METHOD FOR TESTING SEMICONDUCTOR ELEMENT

[75] Inventors: Akira Inoue; Yasuharu Nakajima; Yukio Ohta; Hiroto Matsubayashi, all of Tokyo, Japan

[73] Assignee: Mitsubishi Denki Kabushiki Kaisha, Tokyo, Japan

[21] Appl. No.: 08/779,363

[22] Filed: Jan. 6, 1997

[30] Foreign Application Priority Data

Apr. 5, 1996 [JP] Japan ..................................... 8-84213

[51] Int. Cl.[6] ..................................................... G01R 31/26
[52] U.S. Cl. .............................. 324/769; 324/765; 257/48
[58] Field of Search ................................... 324/765, 766, 324/769; 257/48; 438/14, 17

[56] References Cited

U.S. PATENT DOCUMENTS

| | | | |
|---|---|---|---|
| 3,943,442 | 3/1976 | Fletcher et al. | 324/765 |
| 4,382,229 | 5/1983 | Cottrell et al. | 324/765 |
| 4,779,041 | 10/1988 | Williamson, Jr. | 324/537 |
| 4,896,108 | 1/1990 | Lynch et al. | 324/765 |
| 5,723,983 | 3/1998 | Matsuno | 324/769 |

FOREIGN PATENT DOCUMENTS 58-28673  2/1983  Japan .

OTHER PUBLICATIONS

Vidalou et al., "On–Wafer Large Signal Pulsed Measurements", 1989 IEEE MTT–S Digest, vol. 2, pp. 831–834, Jun. 1989.

Platzker et al., "Characterization of GaAs Devices By A Versatile Pulsed I–V Measurement System", 1990 IEEE MTT–S Digest, vol. 3, pp. 1137–1140, May 1990.

Teyssier et al., "A Pulsed S–Parameter Measurement Setup For The Non–Linear Characterization Of FETs and Bipolar Power Transistors", 23rd European Microwave Conference, Sep. 1993, pp. 489–493.

Barton et al., "Narrow Pulse Measurement Of Drain Characteristics Of GaAs MESFETs", Electronics Letters, vol. 23, No. 13, Jun. 1987, pp. 686–687.

Garcia et al., "An Optimized Method For Computer–Aided DC Measurements Of Power MOS Transistors", IEEE Transactions on Instrumentation & Measurement, vol. 37, No. 3, Sep. 1988, pp. 393–397.

"Simple Tester Checks FET $v_2$ and $g_m$", Electronic Design, vol. 15, No. 10, May 1967, p. 91.

Leslie et al., "Wafer–Level Testing With A Membrane Probe", IEEE Design & Test of Computers, vol. 6, No. 1, Feb. 1989, pp. 10–17.

Primary Examiner—Glenn W. Brown
Attorney, Agent, or Firm—Leydig, Voit & Mayer, Ltd.

[57] ABSTRACT

An apparatus of testing a semiconductor element applies pulsed voltages synchronized with each other, respectively, to a gate and a drain of a semiconductor element being tested and measures current flowing through the semiconductor element in response to the pulsed voltages thus applied. The testing apparatus produces pulsed I–V characteristics considering the influences of self heating and surface energy levels of the semiconductor element and RF swing along a load line during large signal operation.

12 Claims, 16 Drawing Sheets

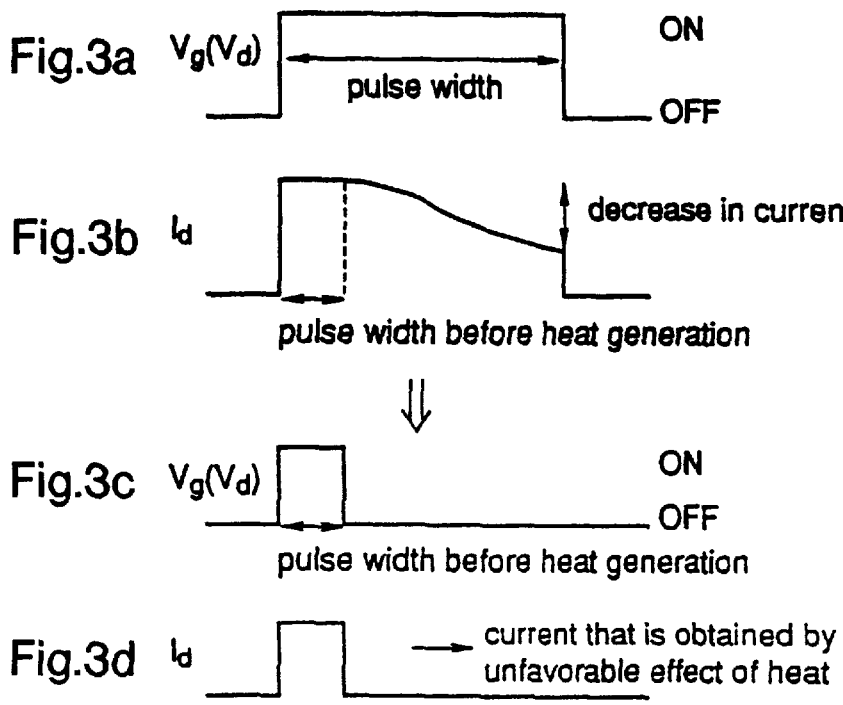
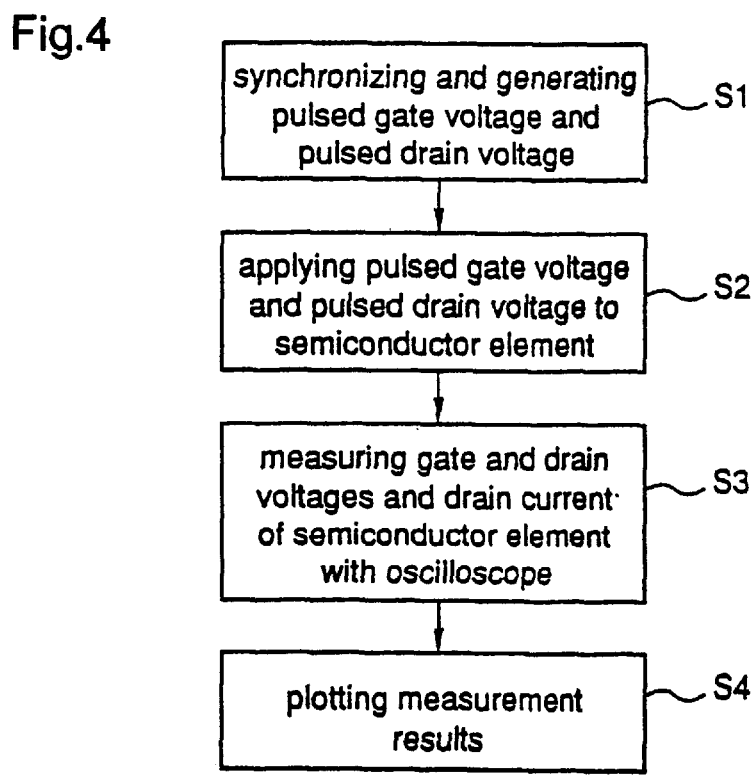

Fig. 15
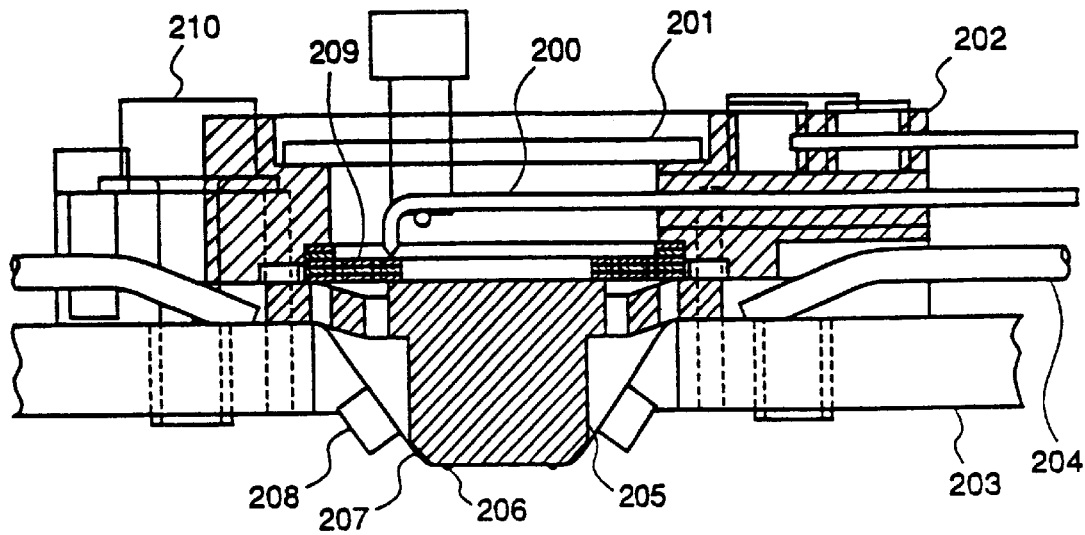
Fig. 16
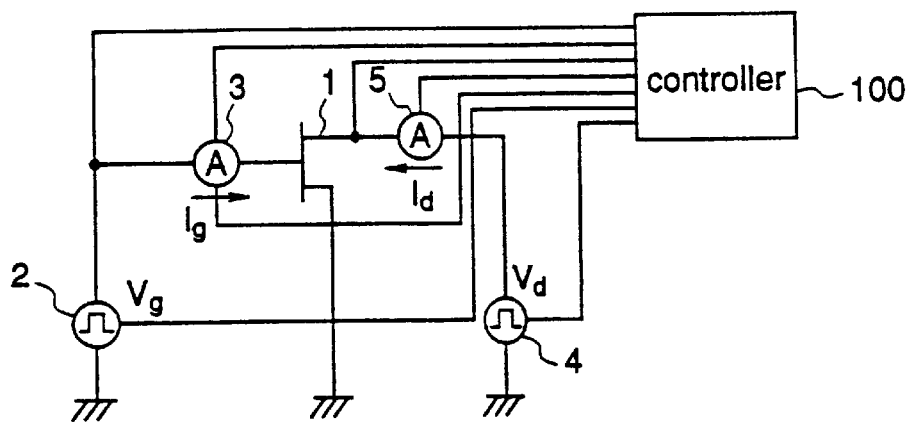
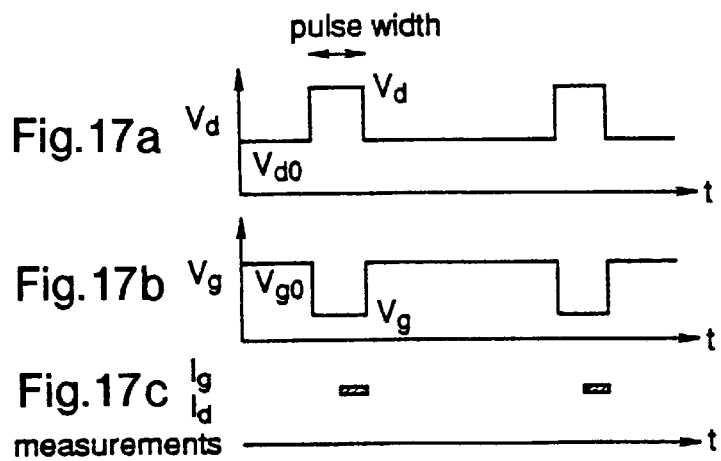
Fig. 17a
Fig. 17b
Fig. 17c

Fig.20
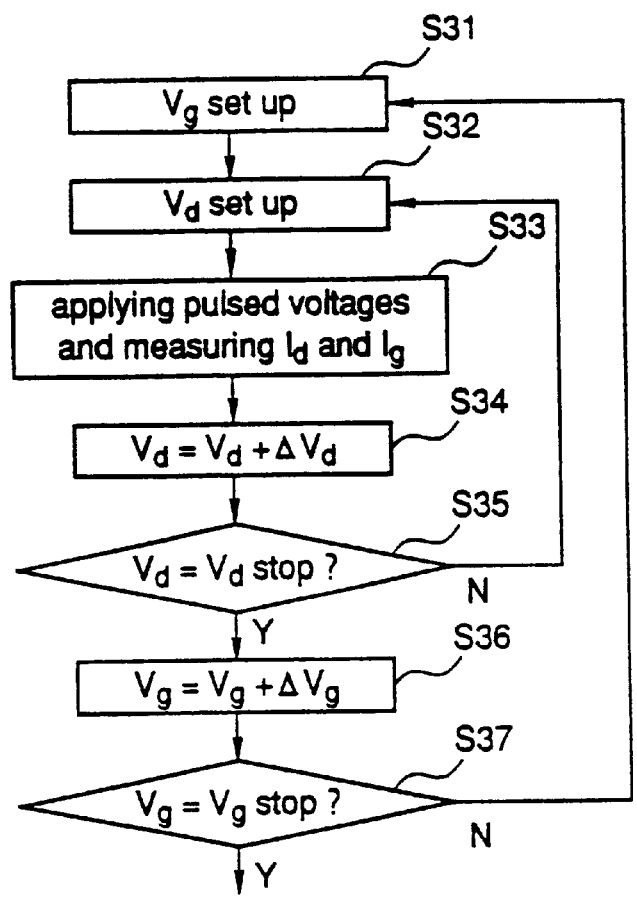
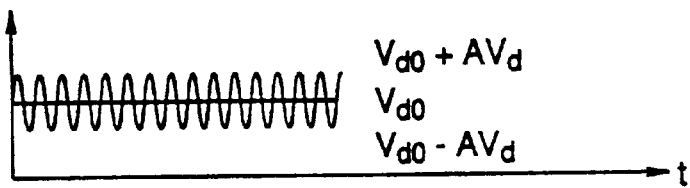
Fig.21a
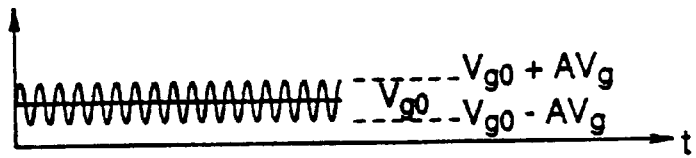
Fig.21b

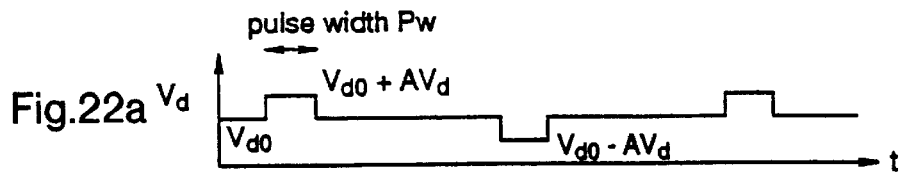
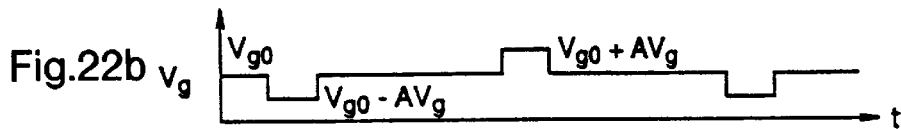
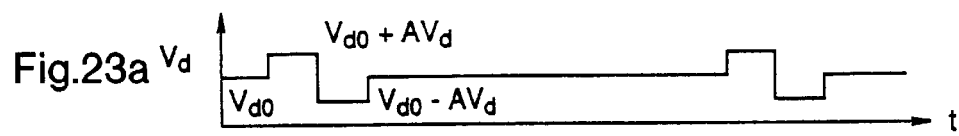
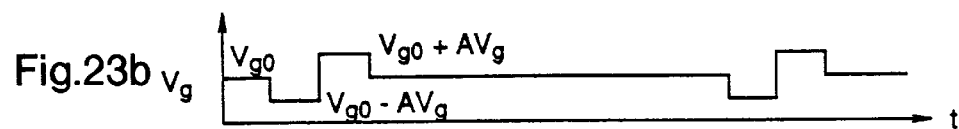
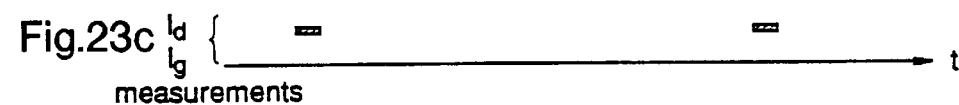
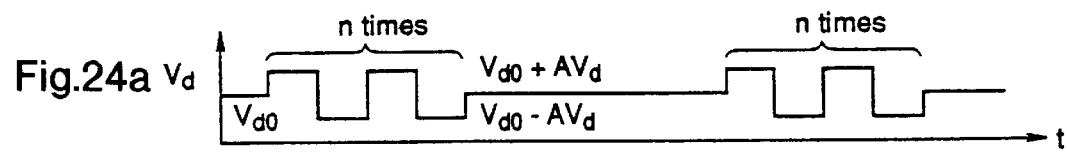
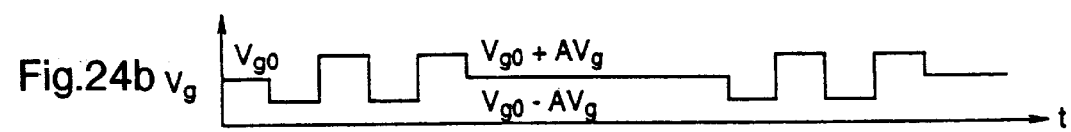

METHOD FOR TESTING SEMICONDUCTOR ELEMENT

FIELD OF THE INVENTION

The present invention relates to an apparatus and a method for testing a semiconductor element utilizing a pulsed I–V measurement system, and a semiconductor device.

BACKGROUND OF THE INVENTION

FIG. 36 is a circuit diagram illustrating a prior art I–V measurement circuit, a kind of apparatus for testing a semiconductor element. In the figure, reference numeral 1 designates a semiconductor element, such as a GaAs FET and an Si FET, as a target of testing. A source of the semiconductor element 1 is connected to a ground 6 of this measurement circuit. Reference numeral 23 designates a DC power source, and the negative pole of the DC power source 23 is connected to the source of the semiconductor element 1. Reference numeral 30 designates a DC power source, and the negative pole of the DC power source 30 is connected to the source of the semiconductor element 1. Reference numeral 31 designates a current measuring apparatus, such as an ammeter, which is connected between a drain of the semiconductor element 1 and the positive pole of the DC power source 23. Reference numeral 32 designates a current measuring apparatus, such as an ammeter, which is connected between a gate of the semiconductor element 1 and the positive pole of the DC power source 30.

Bias voltages from the DC power sources 30 and 23 are respectively applied to the gate and the drain of the semiconductor element 1 as the target of testing. The current flowing through the gate is measured with the current measuring apparatus 32. Then, a change in the drain current flowing through the semiconductor element 1 due to a change in the bias voltage applied to the gate is measured with the current measuring apparatus 31. Consequently, I–V measurements of the target of testing by inputting a continuous wave (hereinafter referred to as CW) are performed.

By measuring I–V characteristics with the CW input, it is possible to measure the current-voltage characteristics of the semiconductor element (FET) in a stable state from the power that is obtained from the product of current flowing through the semiconductor element, and voltage, i.e., the condition in which the current decreases due to heat generation, and in a state in which electronic charges are stable in a depleted layer in the channel and a surface-depleted layer.

The prior art I–V measurement circuit is arranged as shown in FIG. 36 and the I–V measurements are performed with the CW input operation, so that the input is continuously applied to this circuit. Therefore, the I–V characteristics vary because of self-heating, failing to produce accurate I–V measurements.

In addition, in a recess of a GaAs FET, surface energy levels that adversely affect FET characteristics are produced. In the case of pulsed operation, there is a difference between the speed of electrons flowing through the channel and the speed of electrons at the surface, whereby the characteristics vary. In CW operation, however, since the surface charges are in a stable state, the surface levels do not vary, and no influence of the surface levels is produced. As a result, the I–V characteristics cannot be measured, taking into account the influence of the surface levels.

Further, it is impossible to obtain the I–V characteristics considering an RF swing along a load line in large signal operation of a high-power output FET.

SUMMARY OF THE INVENTION

It is an object of the present invention to provide an apparatus and a method for testing a semiconductor element in which a semiconductor element as a target of testing is set to operating conditions, removing the influence of heat, I–V measurements of the semiconductor element are performed at a desired temperature, the I–V characteristics are measured considering the influence of surface levels in a recess of a GaAs system FET, and the I–V characteristics are measured, considering an RF swing along a load line in large signal operation at a high-power output.

It is another object of the present invention to provide a semiconductor device after burn-in by the apparatus and a method for testing a semiconductor element.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, an apparatus of testing a semiconductor element includes means for applying pulsed voltages that are synchronized with each other, respectively, to a gate and a drain of a semiconductor element, a target of testing, and means for measuring a current flowing through the semiconductor element due to the pulsed voltages applied by the means for applying pulsed voltages. Therefore, an apparatus for testing a semiconductor element which realizes pulsed I–V characteristics, considering the influence of heat, of a semiconductor element, and of surface levels in an FET, and an RF swing along a load line in a large signal operation of a high-power output FET is produced.

According to a second aspect of the present invention, a method of testing a semiconductor element includes applying pulsed voltages that are synchronized with each other, respectively, to a gate and a drain of a semiconductor element as a target of testing, and measuring a current flowing through the semiconductor element due to the applied pulsed voltages. Therefore, a method of testing a semiconductor element which realizes pulsed I–V characteristics, considering the influences of heat, of a semiconductor element, and of surface levels in an FET, and an RF swing along a load line in a large signal operation of a high-power output FET is produced.

According to a third aspect of the present invention, a load is interposed on the drain side in the semiconductor element testing apparatus of the first aspect of the invention. Therefore, an apparatus for testing a semiconductor element which realizes pulsed I–V characteristics, considering the influences of heat and surface levels, of an FET, and an RF swing along a load line in a large signal operation of a high-power output FET, when the load is actually interposed, is produced.

According to a fourth aspect of the present invention, a load is interposed on the drain side in the semiconductor element testing method of the second aspect of the invention. Therefore, a method of testing a semiconductor element which realizes pulsed I–V characteristics, considering the influences of heat, of a semiconductor element, and of surface levels in an FET, and an RF swing along a load line in a large signal operation of a high-power output FET, when the load is actually interposed, is obtained.

According to a fifth aspect of the present invention, the semiconductor element testing method of the second aspect of the invention further includes detecting variation of a drain current flowing through the drain due to varying a voltage applied to the gate of the semiconductor element, thereby measuring transconductance, gm, on a load line. Therefore, a method of testing a semiconductor element which enables measurement of transconductance gm on a load line considering the influences of heat and surface levels of, an FET, and an RF swing along a load line in a large signal operation of a high-power output FET is obtained.

According to a sixth aspect of the present invention, the semiconductor element testing method of the second aspect of the invention further includes detecting variations of drain current flowing through the drain due to varying a voltage applied to the gate of the semiconductor element, thereby measuring frequency dispersion of transconductance gm on a load line. Therefore, a method of testing a semiconductor element which enables measurement of frequency dispersion of transconductance gm on a load line, considering the influences of heat and surface levels of an FET, and an RF swing along a load line in a large signal operation of a high-power output FET is obtained.

According to a seventh aspect of the present invention, the semiconductor element testing method of the second aspect of the invention further includes detecting variations of drain current flowing through the drain by varying a voltage applied to the drain of the semiconductor element, thereby measuring drain conductance gd on a load line. Therefore, a method of testing a semiconductor element which enables measurement of drain conductance gd on a load line, considering the influences of heat and surface levels, of an FET, and an RF swing along a load line in a large signal operation of a high-power output FET is obtained.

According to an eighth aspect of the present invention, the semiconductor element testing method of the second aspect of the invention further includes detecting variations of drain current flowing through the drain by varying a voltage applied to the drain of the semiconductor element, thereby measuring frequency dispersion of drain conductance gd on a load line. Therefore, a method of testing a semiconductor element which enables measurement of frequency dispersion of drain conductance gd on a load line, considering the influences of heat and surface levels, of an FET, and an RF swing along a load line in a large signal operation of a high-power output FET is obtained.

According to a ninth aspect of the present invention, a membrane probe is employed in the semiconductor element testing apparatus of the first aspect of the invention. Therefore, on-wafer testing is performed with suppression of a parasitic element.

According to a tenth aspect of the present invention, in the semiconductor element testing method of the fourth aspect of the invention, there are employed pulses having a positive pulse and a negative pulse that are alternately repeated at regular intervals. Therefore, a method of testing a semiconductor element, in which a test is performed at low cost and with high precision without causing hysteresis, is obtained.

According to an eleventh aspect of the present invention, in the semiconductor element testing method of the fourth aspect of the invention, there are employed pulses having a positive pulse and a negative pulse produced immediately after the positive pulse n ($n \geq 1$) times, these pulses being repeated at regular intervals. Therefore, a method of testing a semiconductor element, in which a test is performed at low cost and with high precision without causing hysteresis, is obtained.

According to a twelfth aspect of the present invention, in the semiconductor element testing method of the fourth aspect of the invention, the pulses have a positive pulse and a negative pulse that are alternately repeated. Therefore, a method of testing a semiconductor element, in which a test is performed at low cost and with high precision without causing hysteresis, is obtained.

According to a thirteenth aspect of the present invention, in the semiconductor element testing method of the fourth aspect of the invention, the pulses include a pulse for discharging an electronic charge immediately before applying a pulse for measurement. Therefore, a method of testing a semiconductor element, in which a test is performed at low cost and with high precision without causing hysteresis, is obtained.

According to a fourteenth aspect of the present invention, the semiconductor element testing method of the eleventh aspect of the invention further includes measuring I–V characteristics along a load line using pulses. Therefore, a method of testing a semiconductor element, in which the I–V characteristics along a load line of the element are measured at low cost and with high precision, is obtained.

According to a fifteenth aspect of the present invention, the semiconductor element testing method of the eleventh aspect of the invention further includes calculating drain conductance gd along a load line by sweeping drain voltage Vd with gate voltage Vg at the respective points of the load line, held at a given value. Therefore, a method of testing a semiconductor element, by which drain conductance gd along a load line is calculated at low cost, without causing hysteresis, is obtained.

According to a sixteenth aspect of the present invention, the semiconductor element testing method of the eleventh aspect of the invention further includes calculating transconductance gm along a load line by sweeping gate voltage Vg with drain voltage Vd at the respective points of the load line, held at a given value. Therefore, a method of testing a semiconductor element, by which transconductance gm along a load line is calculated at low cost, without causing hysteresis, is obtained.

According to a seventeenth aspect of the present invention, the semiconductor element testing method of the fourteenth aspect of the invention further includes calculating resistance dependency of the maximum output power $P_{max}$ by sweeping resistance R of a load line and repeating measurement of I–V characteristics along the load line. Therefore, a method of testing a semiconductor element, in which resistance dependency of the maximum output power $P_{max}$ is calculated at low cost, without causing hysteresis, is obtained.

According to an eighteenth aspect of the present invention, in an apparatus for testing a semiconductor element, a semiconductor element is subjected to burn-in using the semiconductor element testing method of the eleventh aspect of the invention. Therefore, an apparatus for testing a semiconductor element, in which burn-in of a semiconductor element is performed without employing an expensive microwave producing apparatus is obtained.

According to a nineteenth aspect of the present invention, in a semiconductor device, burn-in has been performed using the semiconductor element testing method of the eleventh aspect of the invention. Therefore, burn-in is performed without employing an expensive microwave energy generating apparatus, so that the cost required for the burn-in is prevented from increasing the costs of a semiconductor device, thereby producing a low-priced semiconductor device.

BRIEF DESCRIPTION OF THE DRAWINGS

FIGS. 3a, 3b, 3c, and 3d are diagrams illustrating a method of determining conditions to remove the influence of heat in the apparatus for testing a semiconductor element according to the first embodiment of the invention.

FIG. 4 is a flowchart of a method of testing a semiconductor element according to a second embodiment of the present invention.

FIG. 15 is a diagram illustrating a membrane probe card according to a sixth embodiment of the present invention.

FIG. 16 is an equivalent circuit of a measurement system of a testing apparatus.

FIGS. 17a, 17b, and 17c are diagrams showing timing in pulsed I–V measurements.

FIG. 20 is a process flow of general I–V measurements according to the prior art testing method.

FIGS. 21a and 21b are diagrams showing timing of Vd and Vg when high-frequency signals are applied.

FIGS. 22a, 22b, and 22c are diagrams showing timing of Vd and Vg and of current measurements according to a seventh embodiment of the invention.

FIGS. 23a, 23b, and 23c are diagrams showing timing of Vd and Vg according to the seventh embodiment of the invention.

FIGS. 24a, 24b, and 24c are diagrams showing timing of Vd and Vg according to the seventh embodiment of the invention.

DETAILED DESCRIPTION OF THE PREFERRED EMBODIMENT

Embodiment 1

Figure 1:
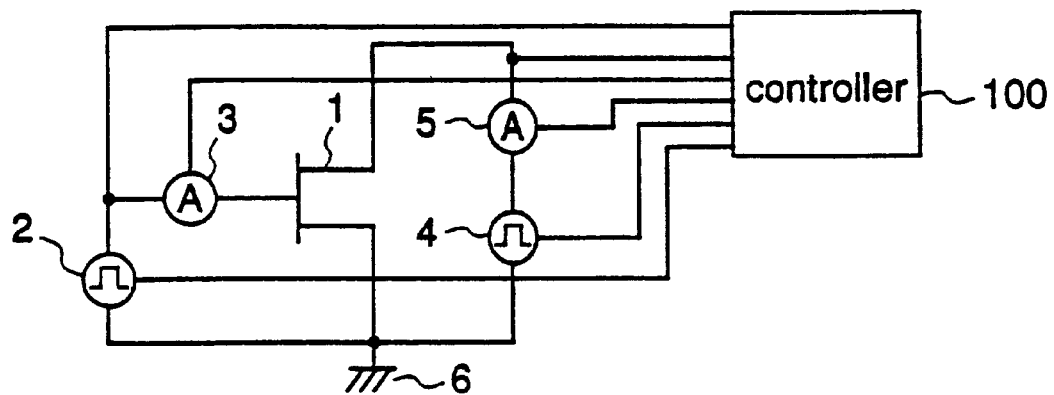
FIG. 1 is a circuit diagram illustrating an apparatus for testing a semiconductor element according to a first embodiment of the present invention.

FIG. 1 is a circuit diagram illustrating a principle structure of an apparatus for testing a semiconductor element according to a first embodiment of the present invention. In the figure, reference numeral 1 designates a semiconductor element, such as a GaAs FET and an Si FET, a target of testing. Reference numerals 2 and 4 designate pulse generators that are synchronized with each other and apply pulsed voltages to the gate and the drain of the semiconductor element 1, respectively. These pulse generators can accurately set voltages under the condition of a load impedance of 50 Ω. Reference numerals 3 and 5 designate current measuring apparatus for monitoring respective currents. The current measuring apparatus 3 is connected between the gate of the semiconductor element 1 and one end of the pulse generator 2, and measures the current flowing from the pulse generator 2 to monitor the load impedance of the pulse generator 2, thereby ascertaining whether the pulse generator 2 is accurately generating the voltage that is set. The current measuring apparatus 5 is connected between the drain of the semiconductor element 1 and one end of the pulse generator 4, and measures the drain current of the semiconductor element 1. Reference numeral 6 designates a ground of this testing apparatus. The source of the semiconductor element 1 and the other ends of the pulse generators 2 and 4 are connected to the ground 6. Reference numeral 100 designates a controller. The controller 100 measures the currents of the current measuring apparatus 3 and 5, and is synchronized with the pulse generators 2 and 4 to measure the output voltages of the pulse generators 2 and 4.

Figure 2:
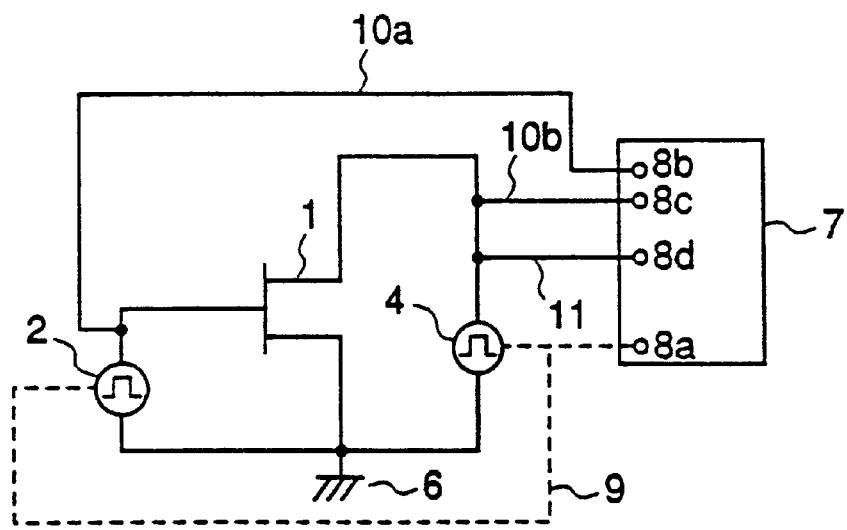
FIG. 2 is a circuit diagram illustrating an apparatus for testing a semiconductor element according to the first embodiment of the invention.

FIG. 2 is a circuit diagram illustrating an apparatus for testing a semiconductor element according to the first embodiment of the invention. In the figure, reference numeral 7 designates an oscilloscope for measuring voltages applied to the semiconductor element 1 and current flowing through the semiconductor element 1. The oscilloscope may be replaced with another instrument that has current and voltage measuring functions and a controlling function similar to those of the oscilloscope 7. Reference numerals 8a to 8d designate input channels of the oscilloscope 7. The input channel 8a is for inputting a triggering signal that is output from the pulse generator 2 or 4 to the other pulse generator. The input channels 8b and 8c are for observing the pulsed voltages that are output from the pulse generators 2 and 4, respectively. The input channel 8d is for observing the current flowing through the semiconductor element 1.

Reference numeral 9 designates a triggering signal line for synchronizing the pulse generators 2 and 4 and the oscilloscope 7. Reference numerals 10a and 10b designate voltage probes for measuring the gate and the drain voltages of the semiconductor element 1, respectively. Reference numeral 11 designates a current probe for measuring the drain current of the semiconductor element 1. Since the pulse generator 2 can accurately generate the voltage that is set, the function corresponding to the current measuring apparatus 3 shown in FIG. 1 is not shown in FIG. 2.

In the apparatus for testing a semiconductor element according to the first embodiment of the invention, one pulse generator 2 (4) produces a triggering signal. The produced signal is input to the other pulse generator 4 (2) and the oscilloscope 7, through the triggering signal line 9. Alternatively, the pulse generators 2 and 4 may receive a triggering signal that is output from the oscilloscope 7. Then, the oscilloscope 7 and the pulse generators 2 and 4 are synchronized with each other, and the pulse generators 2 and 4 generate pulsed voltages and apply the pulsed voltages to the gate and the drain of the semiconductor element (FET) 1, respectively. The oscilloscope 7 is synchronized with the pulse generators 2 and 4 by the triggering signal and receives the pulsed voltages output from the pulse generators 2 and 4 through the probes 10a and 10b, respectively. Further, the oscilloscope receives the drain current flowing through the semiconductor element 1 through the probe 11 for observing the drain current.

Therefore, in the first embodiment of the invention, there can be measured the pulsed I–V characteristics, i.e., the current-voltage characteristics of the semiconductor element (FET), in a transient state of heating that is obtained from the product of current transiently flowing through the semiconductor element and voltage, with the influence of a depleted layer in the channel that is produced due to surface charges transiently varying, and in a transient state of electronic charges in a surface-depleted layer.

By setting a semiconductor element (FET) as described below, operating conditions for removing the influence of heat are determined for the semiconductor element. Specifically, the conditions are determined by heat generated in the semiconductor element (FET) which is obtained from the product of current and voltage, and the heat radiation effect of the semiconductor element and the substrate. Therefore, the conditions of FETs are different depending on the structures of the FETs. In order to determine the conditions, as shown in FIG. 3, a gate voltage Vg (drain voltage Vd) having a relatively large pulse width, for example, 1 to 10 ms, is applied to the semiconductor element to measure a drain current Id, whereby the gate voltage Vg (drain voltage Vd) and the drain current Id are set to have a pulse width before the drain current decreases due to heat generation.

Consequently, according to the first embodiment of the invention, in the apparatus for testing a semiconductor element, the pulse generators 2 and 4 are synchronized with each other to apply pulsed voltages to the semiconductor element, and, further, the oscilloscope 7 is synchronized with the pulse generators. Therefore, it is possible to obtain pulsed I–V characteristics considering the influences of heat and surface levels on the semiconductor element and to distinguish superior elements from inferior ones.

Embodiment 2

FIG. 4 is a flowchart of a method of testing a semiconductor element according to a second embodiment of the present invention.

In FIG. 4, $S_1$ is a process step for synchronizing and generating a pulsed gate voltage and a pulsed drain voltage, $S_2$ is a process step for applying the pulsed gate voltage and the pulsed drain voltage thus synchronized and generated to a semiconductor element, $S_3$ is a process step for measuring a gate voltage, a drain voltage, and a drain current of the semiconductor element with an oscilloscope, and $S_4$ is a process step for plotting the results of the measurements.

Figure 5:
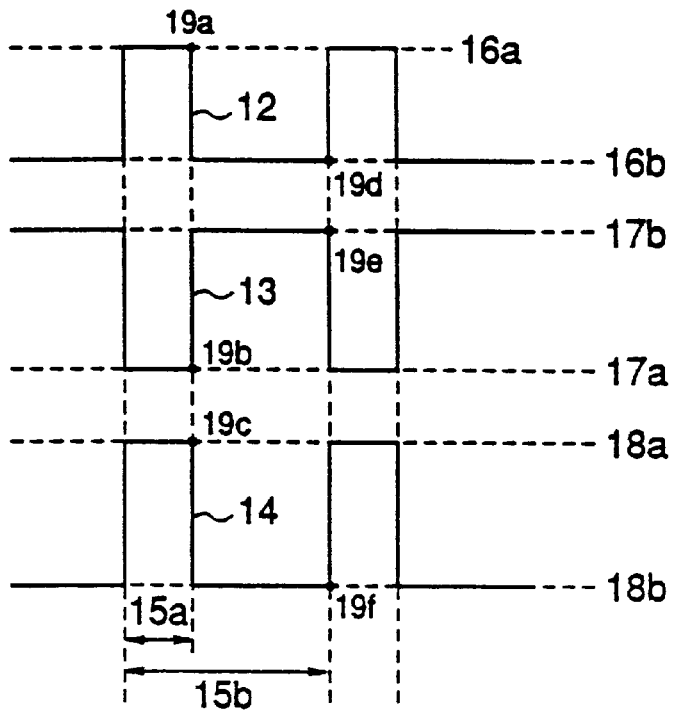
FIG. 5 is a diagram illustrating wave shapes of pulses applied to the respective parts of a semiconductor element in testing of a semiconductor element according to the second embodiment of the invention.

FIG. 5 shows wave shapes of pulses that are applied to the respective parts of a semiconductor element in testing a semiconductor element according to the second embodiment of the invention.

In FIG. 5, reference numeral 12 designates a pulsed gate voltage that is applied to the gate of the semiconductor element 1, numeral 13 designates a pulsed drain voltage that is applied to the drain of the semiconductor element 1, and numeral 14 designates a pulsed drain current that flows through the drain of the semiconductor element 1 as a result of applying the pulsed gate voltage 12 and the pulsed drain voltage 13. Reference numerals 15a and 15b designate a pulse width and a pulse period of the pulsed drain current 14, respectively. Reference numerals 16a, 17a, and 18a designate gate voltage, drain voltage, and drain current respectively, when the semiconductor element 1 is turned on. Reference numerals 16b, 17b, and 18b designate gate voltage, drain voltage, and drain current respectively, when the semiconductor element 1 is turned off. Reference numerals 19a to 19c designate points of observation when the semiconductor element 1 is turned on, and numerals 19d to 19f designate points of observation when the semiconductor element 1 is turned off.

Figure 6:
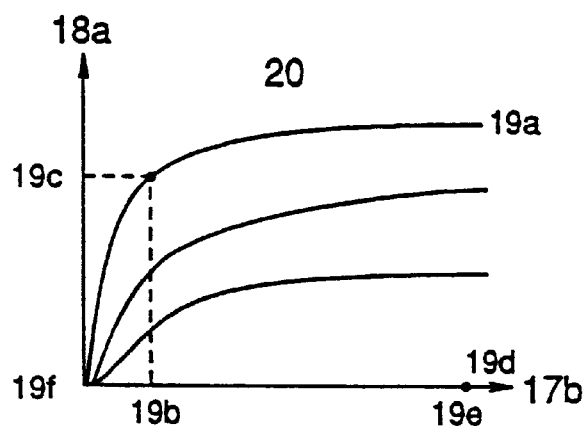
FIG. 6 is a graph showing pulsed I–V characteristics of a semiconductor element according to the second embodiment of the invention.

FIG. 6 is a graph showing the pulsed I–V characteristics when a semiconductor element is measured using the testing method of the second embodiment. The ordinate is set from a few mA to 2 A, and the abscissa is set to 0 to 100 V (usually 20 V).

In FIG. 6, reference numeral 20 designates a pulsed I–V curve. The pulsed I–V curve 20 is obtained by applying the mutually synchronized pulses to the gate and the drain of the semiconductor element, a target of measuring, and plotting the I–V characteristics. More specifically, the drain current 18a is observed at the observation point 19c shown in FIG. 5, which current is obtained when the values of the gate voltage 16a and the drain voltage 17a at the observation points 19a and 19b are respectively varied, whereby the I–V characteristics are plotted.

The method of testing a semiconductor element according to the second embodiment includes, using the apparatus shown in FIG. 2, synchronizing the pulsed gate voltage 12 and the pulsed drain voltage 13 with each other and applying them to the semiconductor element 1, and observing the drain current 14 flowing through the semiconductor element 1.

A more detailed description is given of the testing method. In the process steps $S_1$ and $S_2$ shown in FIG. 4, the pulse generator 2 generates a pulsed gate voltage (16a and 16b) having the pulse width 15a and the pulse period 15b for application to the gate of the semiconductor element 1. The pulse generator 4 generates a pulsed drain voltage (17a and 17b) having the pulse width 15a and the pulse period 15b, which voltage is synchronized with the pulsed gate voltage (16a and 16b), and applied to the drain of the semiconductor element 1. As a result of applying these pulsed voltages, drain current (18a and 18b) flows through the semiconductor element 1.

In the process step $S_3$, the oscilloscope 7 is synchronized with the pulse generators 2 and 4 and measures the gate voltage, the drain voltage, and the drain current that compose the pulsed I–V curve 20 at the observation points 19a, 19b, and 19c, respectively. Further, the oscilloscope 7 measures the gate voltage, the drain voltage, and the drain current when the semiconductor element 1 is turned off, at the observation points 19d, 19e, and 19f, respectively. Finally, in the process step $S_4$, the results of the measurements are plotted.

Figure 7:
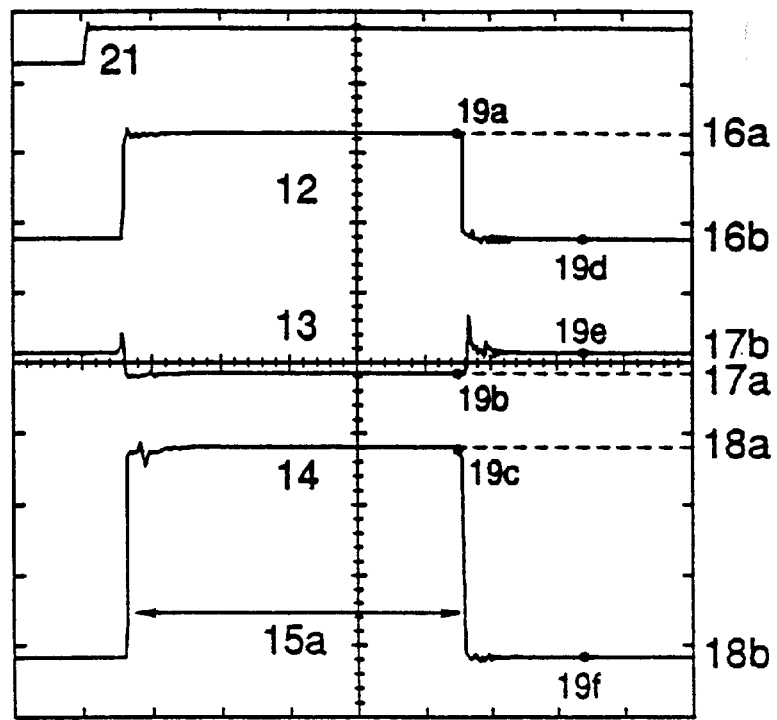
FIG. 7 is a diagram illustrating pulse waveforms when a semiconductor element is tested according to the second embodiment of the invention.

FIG. 7 shows pulse waveforms on the oscilloscope that are observed using the apparatus and method for testing a semiconductor element (FET) according to the present invention. In FIG. 7, reference numeral 21 designates a triggering signal for synchronizing the pulse generators 2 and 4. The pulse width 15a is 1, and the pulse period 15b (not shown) is 100. The gate voltage 16a in the ON state is 0 V, and the gate voltage 16b in the OFF state is −3 V. The drain voltage 17a in the ON state is 0.3 V. In addition, the set voltage is larger than 0.3 V because a current flows into the pulse generator 4.

Figure 8:
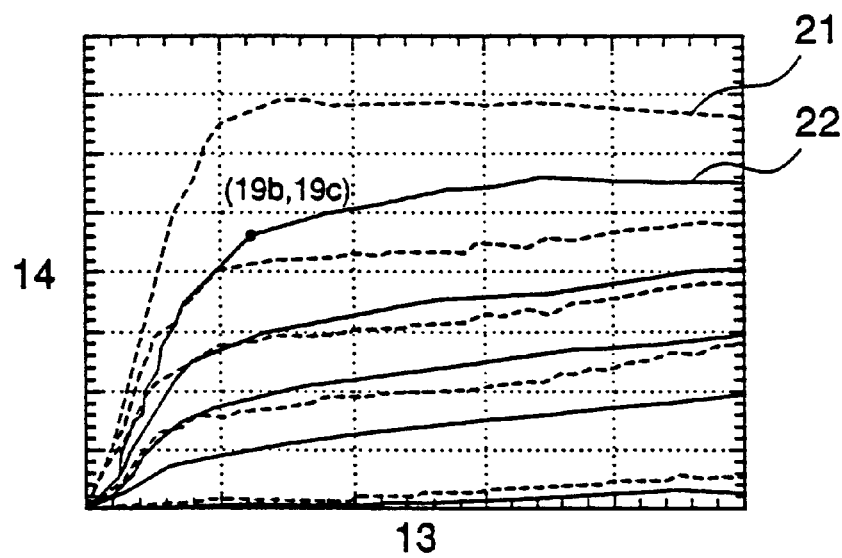
FIG. 8 is a diagram comparing the short-pulse I–V characteristics according to the second embodiment with the prior art I–V characteristics in CW operation.

FIG. 8 shows, as solid lines 22, the results of measurements of the gate voltage, the drain voltage, and the drain current at the observation points 19a, 19b, and 19c, respectively, when the ON-state gate voltage varies and the ON-state drain voltage is as shown in FIG. 7. The ON-state gate voltage are 0, −0.5, −0.75, −1.0, and −1.5 V in descending order. The ON-state drain voltages range from 0 to 5 V, and the OFF-state drain voltage is 6 V.

Figure 36:
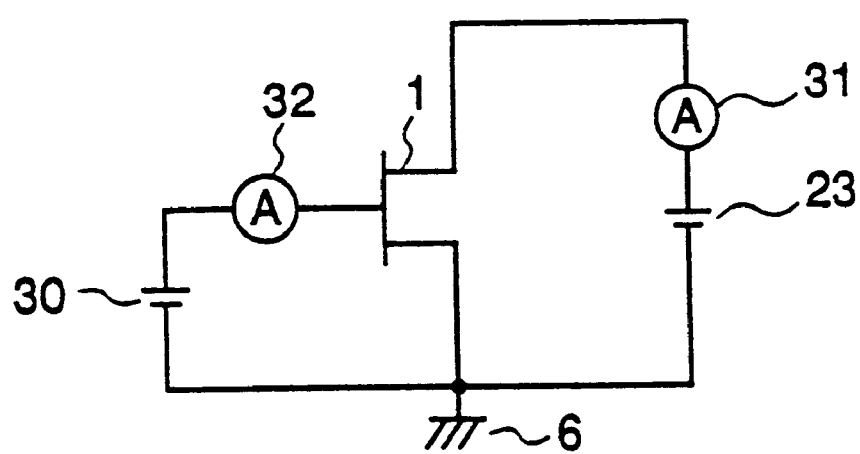
FIG. 36 is a circuit diagram illustrating a principle structure of an apparatus for testing a semiconductor element according to the prior art.

In FIG. 8, the abscissa has a range of 0 to 5 V (1V/div), and the ordinate has a range of 0 to 400 mA (50 mA/div). Broken lines 21 show the I–V characteristics in CW operation according to the prior art apparatus shown in FIG. 36.

As shown in FIG. 8, the short-pulsed I–V characteristics according to the second embodiment are clearly different from the prior art I–V characteristics in CW operation. Therefore, it is required to employ the most suitable apparatus and method for testing the I–V characteristics of a semiconductor element (FET), depending on its use and operating conditions.

In the second embodiment of the invention, in order to determine the conditions for removing the influence of heat, as shown in FIGS. 3a, 3b, and 3c, a gate voltage Vg (drain voltage Vd) having a relatively large pulse width, for example, 1 to 10 ms, is applied to measure a drain current Id, whereby the gate voltage Vg (drain voltage Vd) and the drain current Id are set to have a pulse width before the drain current decreases due to heat generation.

Consequently, according to the second embodiment of the invention, the method of testing a semiconductor element using the testing apparatus of the first embodiment includes synchronizing the pulsed gate voltage 12 and the pulsed drain voltage 13 with each other and applying them to the semiconductor element, whereby the pulsed I–V characteristics, considering the influences of heat and surface levels of the semiconductor element, are obtained.

Embodiment 3

Figure 9:
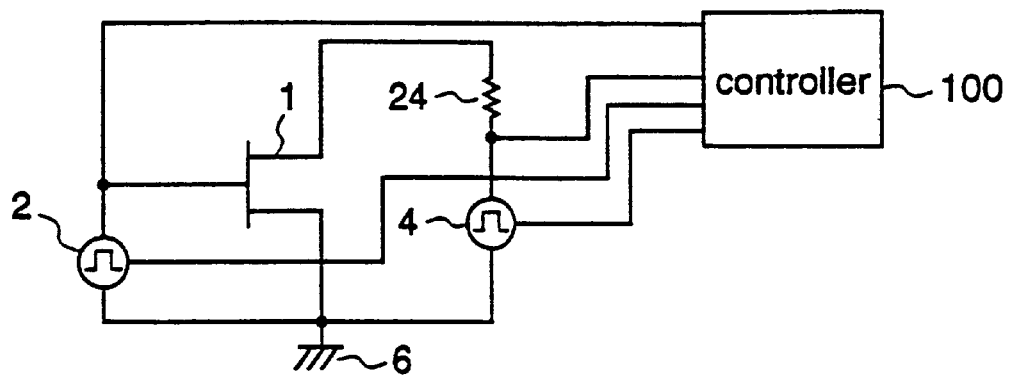
FIG. 9 is a circuit diagram illustrating a principle of an apparatus for testing a semiconductor element according to a third embodiment of the present invention.

FIG. 9 is a circuit diagram illustrating a principle structure of an apparatus for testing a semiconductor element according to a third embodiment of the present invention. In the figure, reference numeral 1 designates a semiconductor element, such as a GaAs FET and an Si FET, a target of testing. Reference numerals 2 and 4 designate pulse generators that are synchronized with each other and apply pulsed voltages to the semiconductor element 1. One end of the pulse generator 2 is connected to the gate of the semiconductor element 1. Reference numeral 24 designates a load, such as a resistor, and the load 24 is connected between one end of the pulse generator 4 and the drain of the semiconductor element 1. Reference numeral 6 designates a ground of this testing apparatus, and the source of the semiconductor element 1 and the other ends of the pulse generators 2 and 4 are connected to the ground 6. Reference numeral 100 designates a controller, and the controller 100 is synchronized with the pulse generators 2 and 4 and measures the output voltages of the pulse generators 2 and 4 and the voltages at both ends of the load 24. The apparatus for testing a semiconductor element shown in FIG. 9 does not have the current measuring apparatus 3 and 5 shown in FIG. 1.

Figure 10:
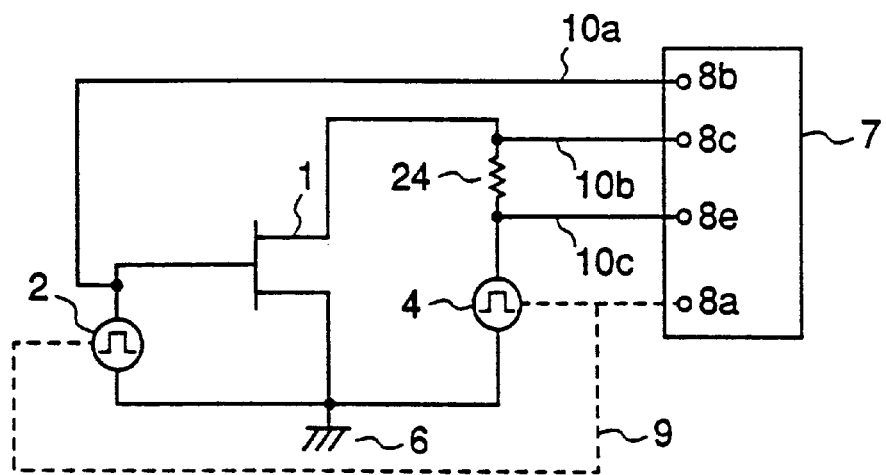
FIG. 10 is a circuit diagram illustrating an apparatus for testing a semiconductor element according to the third embodiment of the invention.

FIG. 10 is a circuit diagram illustrating a structure of an apparatus for testing a semiconductor element according to the third embodiment of the invention. In the figure, reference numeral 7 designates an oscilloscope that measures the voltages applied to the semiconductor element 1 and the current flowing through the semiconductor element 1. The oscilloscope 7 may be replaced with another apparatus which has current and voltage measuring functions similar to those of the oscilloscope 7. Reference numerals 8a to 8c and 8e designate input channels of the oscilloscope 7. The input channel 8a is for inputting a triggering signal that is output from the pulse generator 2 or 4 to the other. The input channel 8b is for observing the pulsed voltage that is output from the pulse generator 2. The input channels 8c and 8e are for observing the voltages at both ends of the resistor 24 that is connected to the drain of the semiconductor element 1. Reference numeral 9 designates a triggering signal line for synchronizing the pulse generators 2 and 4 and the oscilloscope 7. Reference numeral 10a designates a voltage probe for measuring the gate voltage of the semiconductor element 1, and numerals 10b and 10c designate voltage probes for measuring the voltages at both ends of the resistor 24.

As described above, in the apparatus for testing a semiconductor element according to the third embodiment, the resistor 24 is interposed between the drain of the semiconductor element 1 and the pulse generator 4, and both ends of the resistor 24 are connected to the oscilloscope 7.

In the apparatus for testing a semiconductor element according to the third embodiment of the invention, one pulse generator 2 (4) produces a triggering signal. The produced signal is input to the other pulse generator 4 (2) and the oscilloscope 7 through the triggering signal line 9. Alternatively, the oscilloscope 7 may produce a triggering signal received by the pulse generators 2 and 4. Thereby, the pulse generators 2 and 4 and the oscilloscope 7 are synchronized with each other. Then, the pulse generators 2 and 4 generate pulsed voltages and apply them to the gate and the drain of the semiconductor element (FET) 1, respectively. The oscilloscope 7 receives the pulsed voltage output from the pulse generator 2 through the probe 10a. Further, by applying the pulsed voltage output from the pulse generator 4 to the drain of the semiconductor element 1, a current flows through the drain to produce voltages at both ends of the resistor 24, and the oscilloscope 7 receives the voltages from both ends of the resistor 24 through the probes 10b and 10c. The potential differences between the ends is processed in the oscilloscope 7, whereby the drain current flowing through the semiconductor element 1 is observed and the drain voltage of the semiconductor element 1 is also observed.

In the third embodiment of the invention, in order to determine the conditions for removing the influence of heat, as shown in FIG. 3, a gate voltage Vg (drain voltage Vd) having a relatively large pulse width, for example, 1 to 10 ms, is applied to measure a drain current Id, whereby the gate voltage Vg (drain voltage Vd) and the drain current Id are set to have a pulse width before the drain current decreases due to heat generation.

Consequently, according to the third embodiment of the invention, in the apparatus for testing a semiconductor element, the load 24, such as a resistor, is interposed on the drain side of the semiconductor element 1, and the pulsed voltages are applied to the gate and the drain. By applying these pulsed voltages, voltages are produced at both ends of the load 24, and the pulsed current is measured, utilizing the voltages at both ends of the load 24. Therefore, it is possible to obtain pulsed I–V characteristics considering the influences of heat and surface levels of the semiconductor element, and an RF swing along a load line in large signal operation of a high-power output FET.

In addition, the testing apparatus of the third embodiment may have a pulse generator for driving the gate (drain) only on the gate side (drain side).

Embodiment 4

Figure 11:
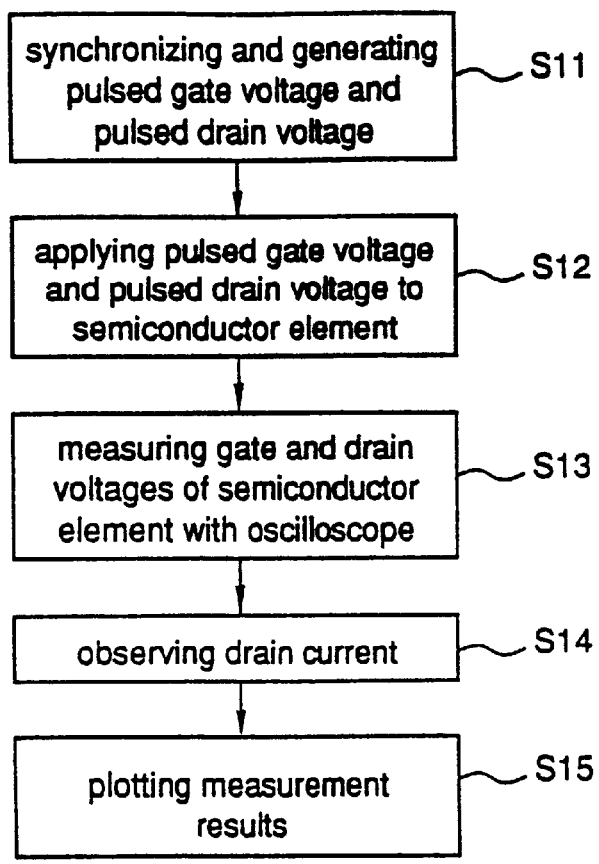
FIG. 11 is a flowchart of a method of testing a semiconductor element according to a fourth embodiment of the present invention.

FIG. 11 is a flowchart of a method of testing a semiconductor element according to a fourth embodiment of the present invention.

In FIG. 11, $S_{11}$ is a process step for synchronizing and generating a pulsed gate voltage and a pulsed drain voltage; $S_{12}$ is a process step for applying the pulsed gate voltage and the pulsed drain voltage, thus synchronized and generated, to a semiconductor element; $S_{13}$ is a process step for measuring a gate voltage and a drain voltage of the semiconductor element with an oscilloscope; $S_{14}$ is a process step for observing a drain current by measuring voltages at both ends of the load with the oscilloscope; and $S_{15}$ is a process step for plotting the results of the measurements.

Figure 12:
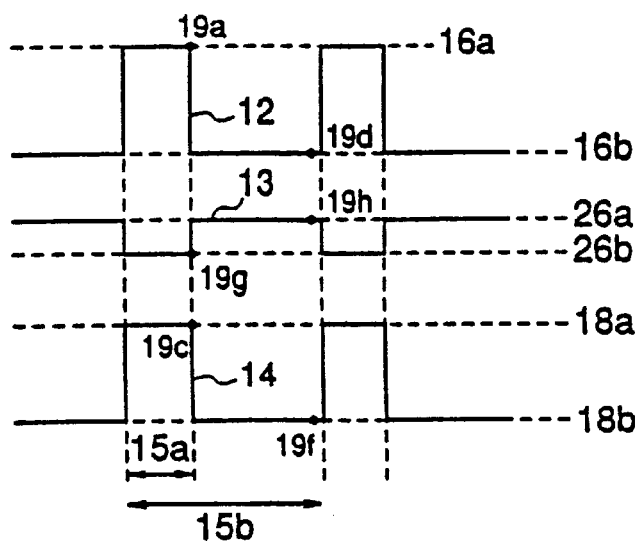
FIG. 12 is a diagram illustrating wave shapes of pulses applied to the respective parts of a semiconductor element in testing a semiconductor element according to the fourth embodiment of the invention.

FIG. 12 shows wave shapes of pulses that are applied to the respective parts of a semiconductor element using the method of testing a semiconductor element according to the fourth embodiment of the invention.

In FIG. 12, reference numeral 12 designates a pulsed gate voltage that is applied to the gate of the semiconductor element 1, numeral 13 designates a pulsed drain voltage that is applied to the drain of the semiconductor element 1, and numeral 14 designates a pulsed drain current that flows through the drain of the semiconductor element 1 in response to the pulsed gate voltage 12 and the pulsed drain voltage 13. Reference numerals 15a and 15b designate a pulse width and a pulse period of the pulsed drain current 14, respectively. Reference numerals 16a, 26a, and 18a designate a gate voltage, a drain voltage, and a drain current, respectively, when the semiconductor element 1 is turned on. Reference numerals 16b, 26b, and 18b designate a gate voltage, a drain voltage, and a drain current, respectively, when the semiconductor element 1 is turned off. Reference numerals 19a, 19g, and 19c designate points of observation when the semiconductor element 1 is turned on, and numerals 19d, 19h, and 19f designate points of observation when the semiconductor element 1 is turned off.

Figure 13:
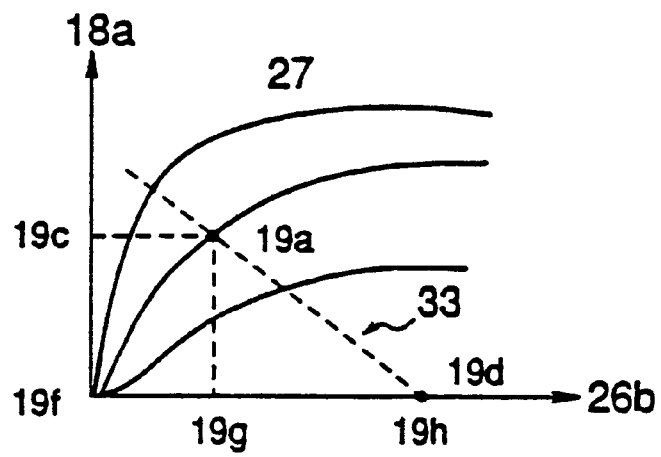
FIG. 13 is a graph showing pulsed I–V characteristics when a semiconductor element is tested according to the fourth embodiment of the invention.

FIG. 13 is a graph showing pulsed I–V characteristics when a semiconductor element is measured using the testing method according to the fourth embodiment. In FIG. 13, reference numeral 27 designates a pulsed I–V curve. The pulsed I–V curve 27 is obtained by interposing the resistor on the drain side of the semiconductor element, a target of measuring, applying the pulsed voltages to the gate and the drain of the semiconductor element for driving them and plotting the I–V characteristics. Reference numeral 33 designates a load line. In FIG. 13, the abscissa has a range of 0 to 5 V (1V/div), and the ordinate has a range of 0 to 400 mA (50 mA/div).

Thus, the method of testing a semiconductor element according to the fourth embodiment includes applying the pulsed gate voltage 12 and the pulsed drain voltage 13 to the semiconductor element 1, measuring the current flowing through the semiconductor element 1 from the potential difference produced at the ends of the resistor 24, and plotting the results of the measurements on the load line 33.

A more detailed description is given of the testing method. In the process steps $S_{11}$ and $S_{12}$, the pulse generator 2 generates the pulsed gate voltage (16a and 16b) having the pulse width 15a and the pulse period 15b and applies them to the gate of the semiconductor element 1. The pulse generator 4 generates the pulsed drain voltage (26a and 26b) having the pulse width 15a and the pulse period 15b, which voltage is synchronized with the pulsed gate voltage (16a and 16b), and applies them to the drain of the semiconductor element 1. As a result of applying these pulsed voltages, the drain current (18a and 18b) flows through the semiconductor element 1.

In the process step $S_{13}$, the oscilloscope 7 is synchronized with the pulse generators 2 and 4, and measures the gate voltage and the drain voltage that compose the pulsed I–V curve 27 at the observation points 19a and 19g, respectively. Further, the oscilloscope 7 measures the gate voltage and the drain voltage when the semiconductor element 1 is turned off at the observation points 19d and 19h, respectively. In the process step $S_{14}$, the drain current is observed at the observation points 19c and 19f with the oscilloscope 7. Finally, in the process step $S_{15}$, the results of the measurements are plotted.

In the fourth embodiment of the invention, in order to determine the conditions for removing the influence of heat, as shown in FIG. 3, a gate voltage Vg (drain voltage Vd) having a relatively large pulse width, for example, 1 to 10 ms, is applied to measure a drain current Id, whereby the gate voltage Vg (drain voltage Vd) and the drain current Id are set to have a pulse width before the drain current decreases due to heat generation.

Consequently, according to the fourth embodiment of the invention, the method of testing a semiconductor element using the testing apparatus of the third embodiment includes applying the pulsed gate voltage 12 and the pulsed drain voltage 13, thereby obtaining pulsed I–V characteristics, considering the influences of heat and surface levels on the semiconductor element, and an RF swing along a load line in large signal operation of a high-power output FET.

In addition, in the fourth embodiment of the invention, the testing may be performed employing a testing apparatus in which a pulse generator for driving the gate (drain) is provided only on the gate side (drain side).

Embodiment 5

Figure 14:
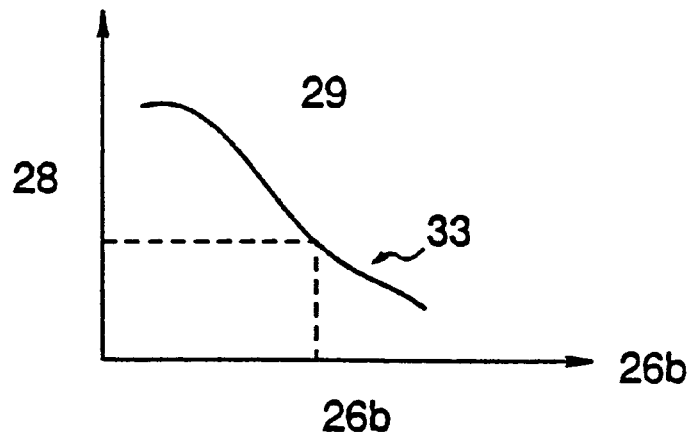
FIG. 14 is a graph showing a method for testing transconductance according to a fifth embodiment of the present invention.

FIG. 14 is a graph showing a method for testing transconductance, gm, using the testing method of the fourth embodiment according to a fifth embodiment of the present invention.

In the figure, reference numeral 28 designates a formula for calculating transconductance, gm, and numeral 29 designates a gm plot that is obtained by interposing a resistor on the drain side of a semiconductor element, applying the pulsed voltages to the gate and the drain, and measuring the current flowing through the drain. In FIG. 14, the abscissa has a range of 0 to 5 V (1V/div), and the ordinate has a range of 0 to 400 mA (50 mA/div). Although the gm plot curves in the fifth embodiment, it does not always curve as shown in FIG. 14, depending on FET characteristics.

The transconductance according to the fifth embodiment is calculated by gm $\Delta$Id/$\Delta$Vg when the ON-state gate voltage 16a is varied by $\pm\Delta$Vg/2, and the variation of the drain current flowing then is $\Delta$Id, whereby the transconductance on the load line 33 is plotted.

Consequently, the method for testing the transconductance using the testing method of the fourth embodiment is described as the fifth embodiment of the invention. Therefore, the gm characteristics are obtained by the pulsed I–V measurement method, taking into account the influences of heat and surface levels on the semiconductor element, and an RF swing along a load line in large signal operation of a high-power output FET is obtained.

More specifically, a simulation, with transconductance gm and the influences of heat and surface levels close to those in actual RF operation, is performed.

In this fifth embodiment of the invention, the transconductance is calculated by arbitrarily varying periods of measurement, using the testing method according to the fourth embodiment, and frequency characteristics are plotted, whereby frequency dispersion of the transconductance along the load line is obtained.

When the transconductance at high frequency is satisfactory, other characteristics of the semiconductor element (FET) are also satisfactory. Therefore, by measuring the transconductance, gm, the quality of other characteristics of the semiconductor element is indirectly checked.

In addition, the drain conductance, gd, is plotted along the load line, using the testing method of the fourth embodiment.

More specifically, the drain conductance gd is calculated as gd=$\Delta$Id/$\Delta$Vd when the ON-state drain voltage 26a is varied by $\pm\Delta$V/2, and variation of the drain current flowing then is $\Delta$Id, whereby the drain conductance, gd, on the load line 33 is plotted.

When the drain conductance at high frequencies is satisfactory, other characteristics of the semiconductor element (FET) are also satisfactory. Therefore, by measuring the drain conductance, other characteristics of the semiconductor element are indirectly checked.

The drain conductance, gd, is calculated by arbitrarily varying periods of measurement using the testing method according to the fourth embodiment, and its frequency characteristics are plotted, whereby the frequency dispersion of the drain conductance, gd, along the load line is obtained.

When the drain conductance, gd, along the load line is satisfactory, other characteristics of the semiconductor element (FET) are also satisfactory. Therefore, by measuring the drain conductance, gd, other characteristics of the semiconductor element are indirectly checked.

In addition, in the fifth embodiment of the invention, the testing may be performed employing a testing apparatus having a pulse generator for driving the gate (drain) only on the gate side (drain side).

In addition, using the testing apparatus of the first embodiment and the testing method of the second embodiment, the transconductance, gm, the drain conductance, gd, the frequency dispersion of the transconductance, gm, and the drain conductance, gd, are obtained.

Specifically, the testing apparatus of the first embodiment may be used as the testing apparatus in the testing method according to the fifth embodiment of the invention. The testing method of the second embodiment may be used in the testing method according to the fifth embodiment of the invention.

Embodiment 6

In the first to fifth embodiments of the invention, patterning is performed on a membrane probe, i.e., a kind of probe card employing a membrane as a flexible material, to constitute a circuit, thereby performing an on-wafer test.

Since this membrane probe is easy to process with respect to capacitance and resistance, an on-wafer test is performed without producing extra parasitic resistance.

FIG. 15 is a diagram illustrating one instance of a membrane probe card according to a sixth embodiment of the invention. In the figure, reference numeral 200 designates an edge sensor needle, numeral 201 designates an optical window for optically ascertaining which of the wafer bumps the membrane probe is contacting, numeral 202 designates a probe frame, numeral 203 designates a probe board corresponding to a probe substrate, numeral 204 designates a coaxial cable for supplying RF signals, numeral 205 designates a plunger for fixing the bumps, numeral 206 designates a nickel bump serving as a probe needle, numeral 207 designates a membrane as a flexible material, numeral 208 designates a chip cap (optical), numeral 209 designates a spring for elasticity, and numeral 210 designates a mounting screw.

Generally, it is thought that large signal characteristics of a semiconductor device, such as an FET and an HBT, are revealed to a considerable extent by the I–V characteristics of an element. Therefore, there is a method of distinguishing an element by measuring the I–V characteristics of the element. However, in a semiconductor device that is employed at frequencies not less than several hundreds of MHz, because various traps due to impurities and lattice stress cause delay, it is required to perform measurements with short pulses having a pulse width of not more than several hundreds of $\mu$sec.

These measurements are performed with an apparatus as shown in FIG. 16. FIG. 16 is a circuit diagram illustrating an equivalent circuit of a measurement system of a testing apparatus according to the sixth embodiment of the invention. The structure of the apparatus shown in FIG. 16 is the same as that shown in FIG. 1. In the figure, reference numeral 1 designates a semiconductor element, such as an FET or an HBT. In this case, an FET is employed as the element. Reference numerals 3 and 5 designate ammeters, and numerals 2 and 4 designate pulse generators. At the times shown in FIGS. 17a and 17b, $Vd_0$ and $Vg_0$ are respectively applied to the drain and the gate of the FET 1, except for periods corresponding to the pulse width, and the pulsed voltages Vd and Vg are respectively applied for periods corresponding to the pulse width, for measuring the currents Id and Ig at the times indicated in FIG. 17c. In addition, the pulse width is 100 ns, Vd is in a range of 10 to 20 V, Vg is 5 V, Id is in a range of several tens of mA to 20 A, and Ig is a few mA.

Reference numeral 100 designates a controller, and the controller 100 measures the currents of the ammeters 3 and 5. Further, the controller is synchronized with the pulse generators 2 and 4 and measures the output voltages of the pulse generators 2 and 4.

FIG. 20 shows the measurement process. Initially, the pulsed voltage Vg is set (step $S_{31}$) and the pulsed voltage Vd is set (step $S_{32}$). In the process step $S_{33}$, the pulsed voltages are applied to measure the currents Id and Ig. In process steps $S_{34}$ and $S_{35}$, the measurements are repeated by varying Vd by $\Delta$Vd until the Vd becomes $Vd_{stop}$. In process steps $S_{36}$ and $S_{37}$, the measurements are repeated by varying Vg by $\Delta$Vg until the Vg becomes $Vg_{stop}$.

Figure 18:
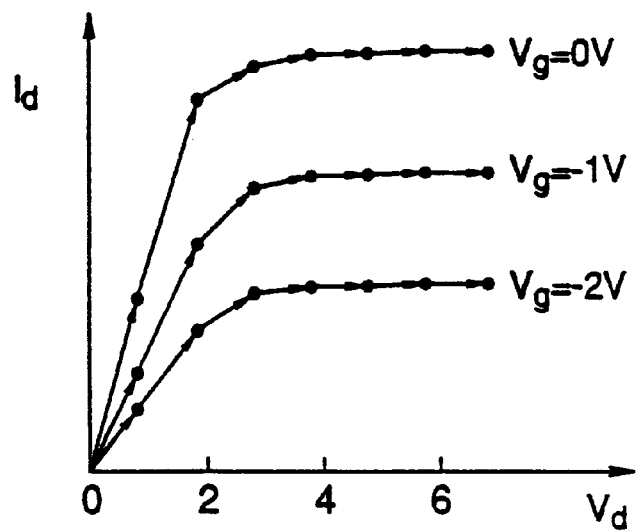
FIG. 18 is a graph showing measured I–V characteristics when ΔVd is larger than 0 according to the prior art testing method.

FIG. 18 is a graph showing the results of the measurements when $\Delta$Vd is 1 V, $\Delta$Vg is −1 V, $Vd_{stop}$ is 8 V, $Vg_{stop}$ is −3 V, and Id is in a range of several tens of mA to 20 A. Generally, in a semiconductor device having various traps, electrons and holes are captured in respective traps and released with respective time constants. Therefore, the states of the traps are affected by the order of the I–V measurements, whereby the results of the measurements are different. This phenomenon is called "hysteresis" because the measured values differ according to the measurement paths.

Figure 19:
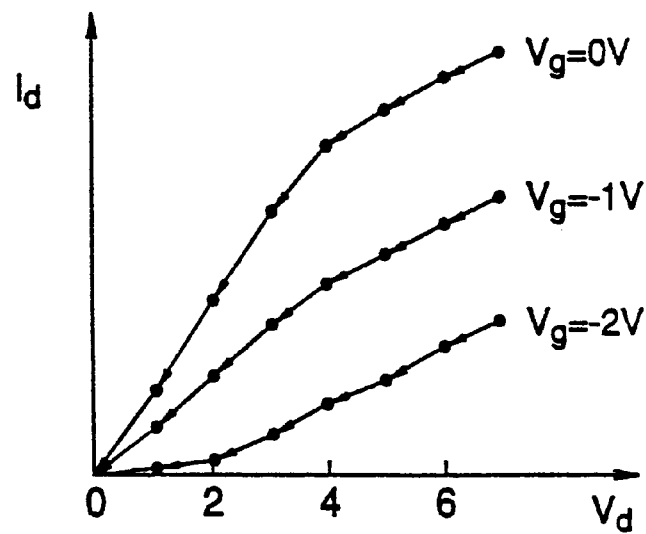
FIG. 19 is a graph showing measured I–V characteristics when ΔVd is smaller than 0 according to the prior art testing method.

An example of hysteresis is described. FIG. 19 is a graph showing the results of measurements when $\Delta$Vd is −1 V, $\Delta$Vg is −1 V, $Vd_{stop}$ is −1 V, $Vg_{stop}$ is −3 V, and Id is in a range of 20 A to several tens mA. In this case, Vd is applied through a path reverse to that shown in FIG. 18, so that the results of the I–V measurements are different from those shown in FIG. 18.

When an FET actually operates at high frequency, as shown in FIGS. 21a and 21b, signals that are obtained by adding sinusoidal waves having amplitudes AVd and AVg to the drain voltage $Vd_0$ and the gate voltage $Vg_0$, as bias levels of the FET, respectively, are applied. Therefore, due to the signals of $Vd_0 \pm AVd$, and $Vg_0 \pm AVg$, capture and release of electrons and holes at the respective traps are repeated, resulting in a stationary state. Consequently, the I–V measurements causing the hysteresis are different from measurements during actual high-frequency operation, so that the I–V measurements cannot be used for element distinction. In addition, in FIGS. 21a and 21b, one sinusoidal wave is 1 to 0.1 ns, Vd is 20 to 10 V, and Vg is 5 V.

Further, since the I–V characteristics of the element obtained in the pulsed I–V measurements do not always correlate with the large signal characteristics of the element, a test including inputting high-frequency signals must be performed, so that testing cost increases, resulting in an expensive semiconductor device.

In addition, a burn-in test of a semiconductor device is usually performed by applying high-frequency signals, thus increasing the cost of an apparatus for the burn-in test. Accordingly, a semiconductor device to which the burn-in has been performed also increases the cost.

A semiconductor device in which the costs of an apparatus and a method of testing a semiconductor element causing no hysteresis, and the cost of a burn-in test are reduced, thereby preventing cost increases, is described in the following embodiments.

Embodiment 7

In order to realize measurements causing no hysteresis as described above, the high-frequency signals as shown in FIG. 21 should be directly applied to a semiconductor element to measure current and voltage waveforms. However, the cost of an apparatus increases as the frequency increases, and it is difficult to sufficiently maintain measurement precision. Therefore, by applying pulses each having a pulse width from several hundreds of $\mu$sec to several hundreds of nsec as shown in FIG. 22, and performing I–V measurements, it is possible to perform the same measurements as in the actual operation shown in FIGS. 21a and 21b.

More specifically, by adding pulses of ±AVd and ±AVg respectively to the drain voltage $Vd_0$ and the gate voltage $Vg_0$, as bias voltages of the FET, that is, by adding pulses of +AVd, −AVd, +AVd, −AVd, . . . , i.e., positive and negative pulses that are alternately repeated, to the drain voltage $Vd_0$, and adding pulses of −AVg, +AVg, −AVg, +AVg, . . . , i.e., pulses that have a phase opposite to the phase of the pulses added to the drain voltage, to the gate voltage $Vg_0$, the electric field is applied alternately to the bias points as when the sinusoidal waves shown in FIG. 21 are applied. Therefore, capture and release of electrons and holes at the respective traps occur as in actual operation, whereby I–V characteristics equivalent to those in actual operation are measured.

Strictly speaking, the time constant of the electric field applied to each trap is longer than the time constant during actual operation. More specifically, in 1 GHz operation, the time constant got one half-wave is 500 psec, while the time constant at a pulse width that is measured is longer, i.e., 100 nsec. It is known that the shortest time constants of the respective levels of various semiconductors, such as compound semiconductors, are generally on the order of 100 nsec. Consequently, even when measurements are performed with pulses having a time constant shorter than 100 nsec, the effect of the traps is not different from when the time constant is 100 nsec, so that measurements equivalent to those in actual operation are possible.

In addition, in FIGS. 22a and 22b, after a pulse having positive (negative) polarity is added to the bias voltage of the FET, a pulse having negative (positive) polarity is added at a regular interval, and the same operation is repeated. As shown in FIGS. 23a and 23b, however, a pulse having negative (positive) polarity is added immediately after a pulse having positive (negative) polarity is added to the bias voltage of the FET, and the same operation is repeated at regular intervals. As a result, the same effect as shown in FIGS. 22a and 22b is obtained.

As shown in FIGS. 24a and 24b, the operation of producing a negative (positive) pulse immediately after producing a positive (negative) pulse having a pulse width pw may be repeated n times, followed by repeating the above-mentioned operation at regular intervals. Thereby, frequency dispersion of the pulses is suppressed and data are measured many times in a fixed measuring time, so that measurement precision is improved.

Figure 25A:
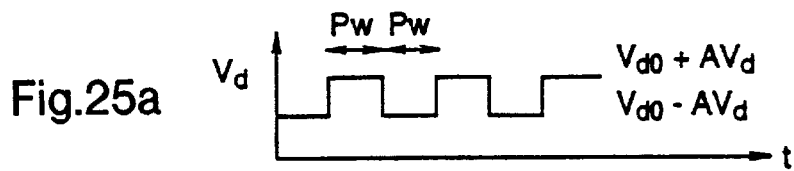
FIGS. 25a, 25b, and 25c are diagrams showing timing of Vd and Vg according to the seventh embodiment of the invention.
Figure 25B:
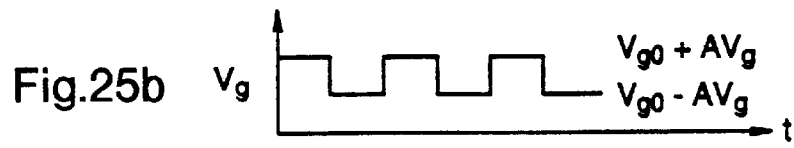
Figure 25C:

FIGS. 25a and 25b show the timing where n, as shown in FIGS. 24a and 24b, is infinite. By these timings, the maximum time of measurements per unit time is obtainable, and frequency dispersion is reduced to a minimum. Generally, there is required time for charging a capacitor for producing a pulsed output of a pulse generator. Accordingly, it is difficult to say n is infinite in the measurement in which Id is large. Consequently, the times shown in FIG. 24 in which n is finite are selected in practice, depending on Id.

In addition, in FIGS. 21a, 21b, 21c, 22a, 22b, 22c, 23a, 23b, 23c, 24a, 24b, 24c, 25a, 25b, and 25c, the pulse width is 100 ns, Vd is in a range of 20 to 10 V, Vg is 5 V, Id is in a range of 20 A to several tens of mA, and Ig is a few mA.

Although short pulses are used in the seventh embodiment of the invention, other types of pulses, such as sinusoidal waves and Gaussian waves, may be employed. In the case of the sinusoidal waves, it is difficult to produce pulses and to control measurement timing. However, there is the advantage that frequency dispersion is suppressed. In this regard, it is preferable to employ sinusoidal waves.

As described above, according to the seventh embodiment of the invention, the voltages that are obtained by superposing the positive and negative pulses on the bias voltages are applied to the semiconductor element, a target of measurement. Therefore, I–V characteristics corresponding to those in the actual operation are measured without hysteresis. Further, because of the use of low-frequency pulses, it is possible to fabricate the apparatus at low cost, to perform accurate and high-speed measurements, and to suppress the frequency dispersion of the pulses.

Figure 26A:
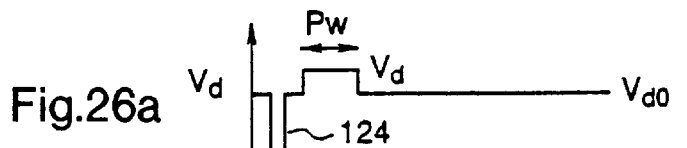
FIGS. 26a, 26b, and 26c are diagrams showing timing of Vd and Vg according to the seventh embodiment of the invention.
Figure 26B:
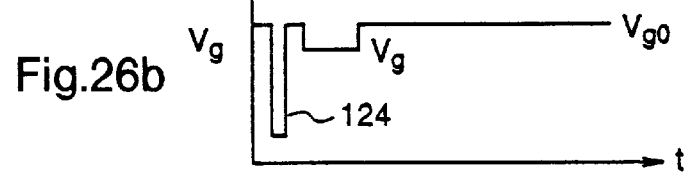
Figure 26C:

In accordance with timings shown in FIGS. 26a and 26b, by applying charging pulses having a large amplitude and negative polarity, before applying pulses for measurement, it is possible to charge the traps, so that every trap is completely filled and emptied during a measurement cycle. In addition, in FIGS. 26a, 26b, and 26c, the charging pulse 124 is, for example, –3 V to –5 V, the pulse width is 100 ns, Vd is in a range of 20 to 10 V, Vg is 5 V, Id is in a range of 20 A to several tens of mA, and Ig is a few mA.

Consequently, according to the seventh embodiment of the invention, the respective traps are always in a steady state due to addition of the charging pulses. Therefore, the I–V characteristics corresponding to those in the actual operation are accurately measured without causing hysteresis. Further, because of the low-frequency pulses, the apparatus can be fabricated at low cost, leading to accurate and high-speed measurements.

Embodiment 8

Figure 27:
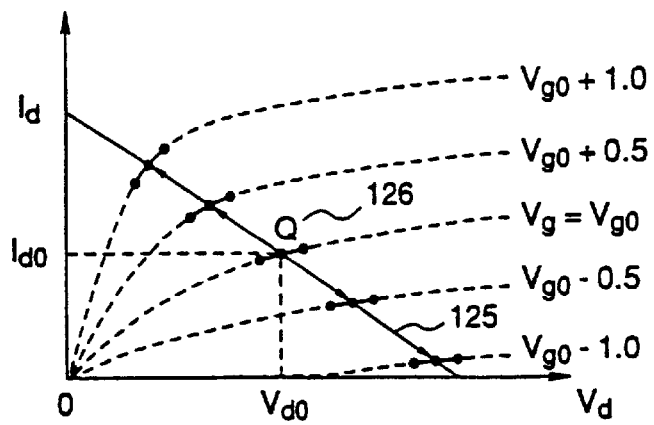
FIG. 27 is a graph showing the measured I–V characteristics along a load line according to an eighth embodiment of the invention.

FIG. 27 is a graph showing the results when I–V measurements are performed along a load line 125. A load line of load resistance R has a relation of $$Vd-Vd_0=-(Id-Id_0)R$$

when a load having resistance R is provided on the output side of an FET. Reference numeral 126 designates a Q point, and the Q point is a bias applying point (drain voltage $Vd_0$, gate voltage $Vg_0$). In the measurements, the amplitude of Vg is set to 0, 0.5, and 1.0 V, with the Q point in the center. In FIG. 27, Vd is in a range of 20 to 10 V, and Id is in a range of 20 A to several tens of mA.

Figure 28:
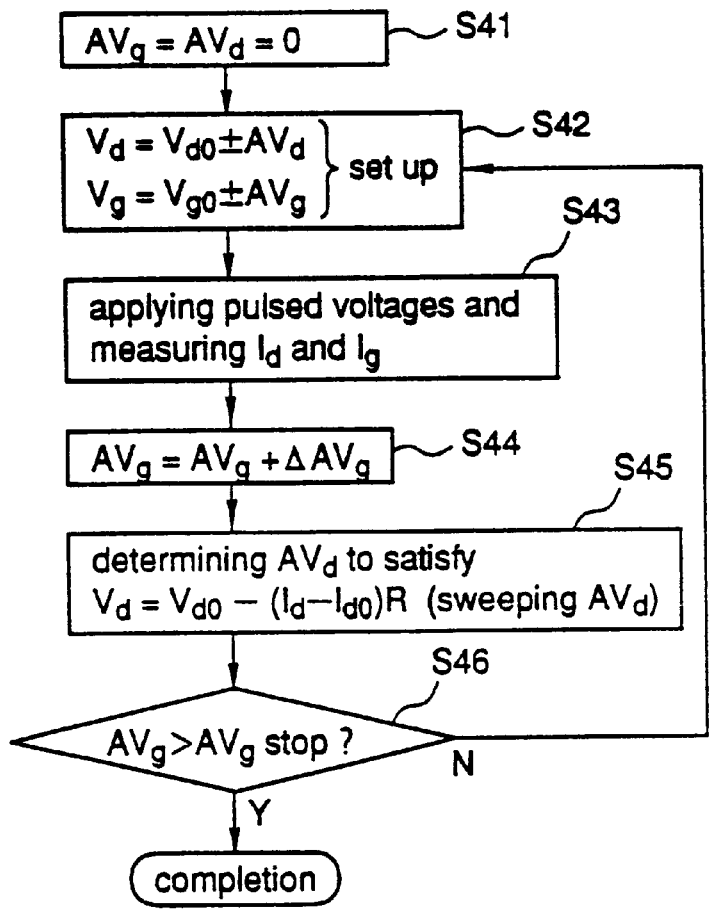
FIG. 28 is a process flow of I–V measurements along a load line according to the eighth embodiment of the invention.

FIG. 28 shows the measurement process. Initially, in process steps $S_{41}$, $S_{42}$ and $S_{43}$, pulses as shown in FIGS. 22 to 26 are applied to the Q points (AVd=AVg=0) to measure Id and Ig. Then, in process steps $S_{44}$ and $S_{45}$, putting AVg=0.5 V, Vd (Vd=$Vd_0 \neq$AVd) is determined to satisfy Vd–$Vd_0$=–R(Id–$Id_0$). That is, as shown in FIG. 27, the value of Vd is swept to obtain intersection points of the load line 125 and the I–V curves of Vg±0.5 (V), thereby obtaining values of Vd. In process step $S_{46}$, it is ascertained whether AVg is larger than $AVg_{stop}$. The same operation as described above is performed in the case of AVg=1.0 V.

Figure 29:
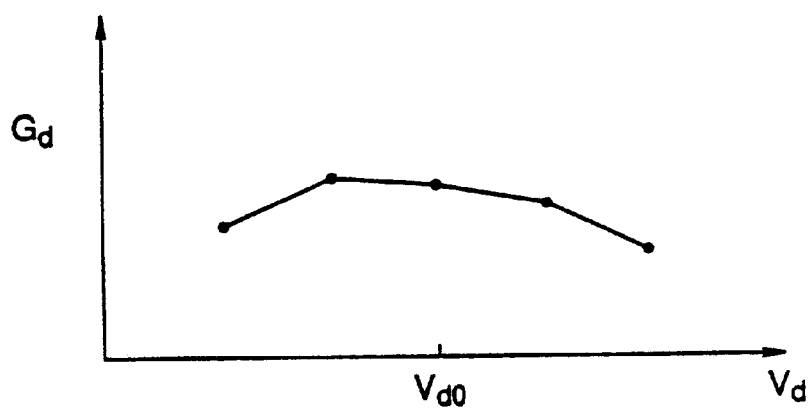
FIG. 29 is a graph showing the results of Gd measurements along a load line according to the eighth embodiment of the invention.

Since the value of Vd is swept, drain conductance, gd, at the respective points on the load line 125 is easily calculated by $$gd=\Delta Id/\Delta Vd$$

whereby the drain conductance gd along the load line is easily obtained as shown in FIG. 29. In addition, in FIG. 29, gd is in a range of 0.01 to 0.1, and Vd is in a range of 20 to 10 V.

As described above, in the eighth embodiment of the invention, with the positive and negative pulses having opposite amplitudes with respect to the Q points, Id and Vd at the respective points along the load line are measured by sweeping Vd with Vg fixed. Therefore, the drain conductance gd along the load line equivalent to that in the actual operation is measured without causing hysteresis. Further, since only portions along the load line are measured, the measured points are fewer than those shown in FIGS. 18 and 19, whereby high-speed measurements are possible.

Figure 31:
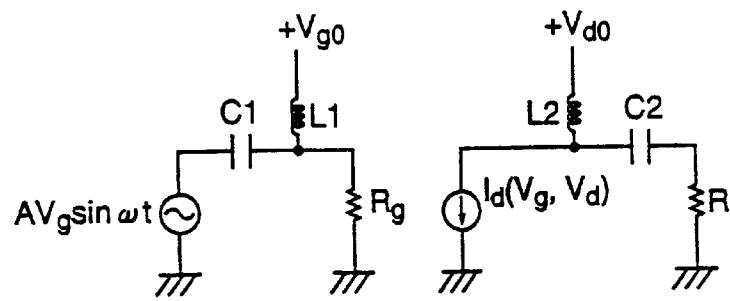
FIG. 31 illustrates a simple equivalent circuit of an FET according to the eighth embodiment of the invention.

By obtaining the data of Id and Vd along the load line 125, input and output characteristics of a semiconductor element having load resistance R are obtained by calculation. More specifically, with simple models of equivalent circuits having input resistance Ri as shown in FIG. 31, $$Vg=Vg_0+AVg \sin \omega t$$

Input power $P_{in}=(Vg^2/Ri)dt$

Output power $P_{out}=I^2 dRdt$

Average drain current at high-frequency input $Id_{RF}=Iddt$ are obtained.

In FIG. 31, AVg sin ωt represents an alternating-current component of the gate voltage that is input, C1 represents equivalent capacitance, L1 represents equivalent inductance, +$Vg_0$ and +$Vd_0$ represent bias sources, Rg represents a gate resistance, Id (Vg and Vd) represents an equivalent current source, and R represents a load resistor.

From this calculation, the maximum output power at the load R, $P_{max}$, and $P_{2dB}$, power added efficiency PAE, drain efficiency $E_D$, etc. are given.

Although the models shown in FIG. 31 are used as a model of an FET, other models may be employed.

Consequently, according to the eighth embodiment of the invention, voltages that are obtained by superposing positive and negative pulses on the bias voltages are applied to the semiconductor element, a target of measurement. Therefore, the I–V characteristics corresponding to those in actual operation are measured without causing hysteresis. Further, because of the low-frequency pulses, it is possible to fabricate an apparatus at low cost, to perform accurate and high-speed measurements, and to measure gd and gm along a load line.

Figure 30:
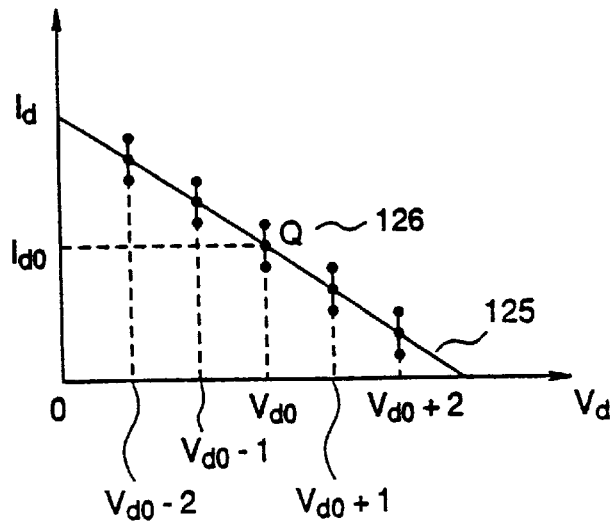
FIG. 30 is a graph showing measured I–V characteristics along a load line according to the eighth embodiment of the invention.
Figure 32:
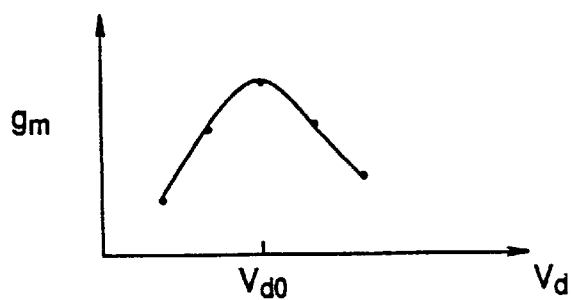
FIG. 32 is a graph showing measured gm along a load line according to the eighth embodiment of the invention.

In addition, in the eighth embodiment of the invention, although the I–V characteristics along the load line are measured by fixing Vg and sweeping Vd, there is a method of fixing Vd and sweeping Vg as shown in FIG. 30. In this case, gm at the respective points is easily calculated by $$gm = \Delta Id/\Delta Vg$$

whereby gm along the load line is easily indicated as shown in FIG. 32. In addition, in FIG. 32, gm is in a range of 0.1 to several tens, and Vd is in a range of 20 V to 10 V.

Figure 33:
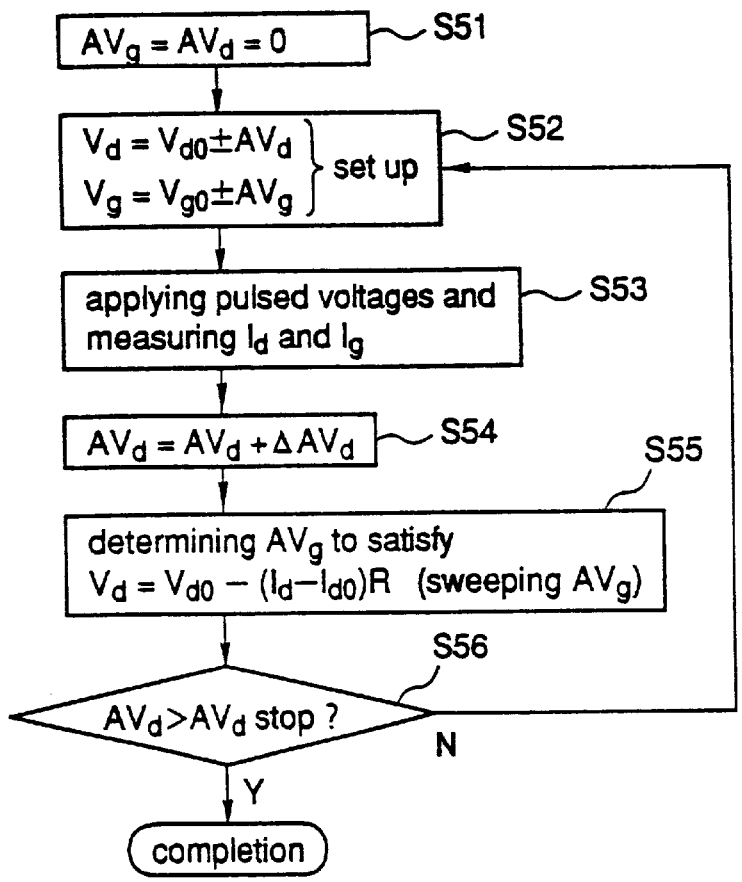
FIG. 33 is a process flow of I–V measurements along a load line according to the eighth embodiment of the invention.

FIG. 33 shows a process flow of the measurement. Initially, in the process steps $S_{51}$, $S_{52}$, and $S_{53}$, pulses as shown in FIGS. 22 to 26 are applied to the Q points ($\Delta Vd=\Delta Vg=0$) to measure Id and Ig. Then, in the process steps $S_{54}$ and $S_{55}$, putting $\Delta Vd=0.5$ V, Vd (Vd=Vd$_0 \neq \Delta Vd$) is determined to satisfy Vd–Vd$_0$=–R (Id–Id$_0$). That is, in FIG. 30, the value of Vg is swept to obtain intersection points of the load line 125 and the I–V curves of Vg±0.5 (V), thereby obtaining values of Vg. In the process step $S_{56}$, it is ascertained whether $\Delta Vd$ is larger than $\Delta V_{stop}$. The same operation as described above is performed in the case of $\Delta Vd=1.0$ V.

Consequently, according to the eighth embodiment of the invention, with positive and negative pulses having opposite amplitudes with respect to the Q points, Id and Vd at the respective points along the load line are measured by sweeping Vg under the condition that Vd is fixed. Therefore, gm along a load line equivalent to actual operation is measured without causing hysteresis. Further, it is possible to fabricate an apparatus at low cost, to perform accurate and high-speed measurements, and to calculate $P_{max}$ and $P_{2dB}$ to obtain their load dependencies.

Figure 34:
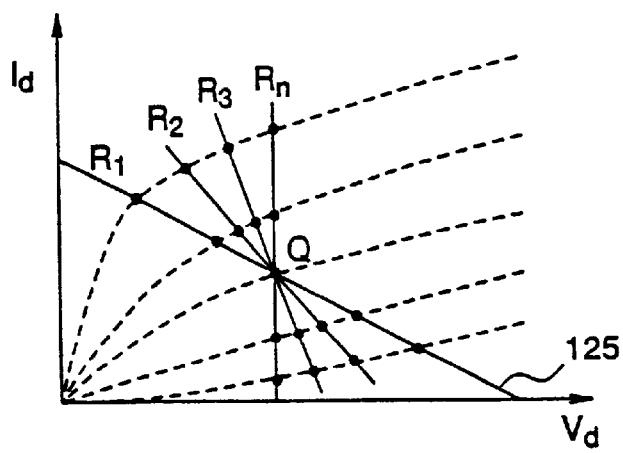
FIG. 34 is a graph showing measured I–V characteristics that are obtained by sweeping load resistance R according to the eighth embodiment of the invention.
Figure 35:
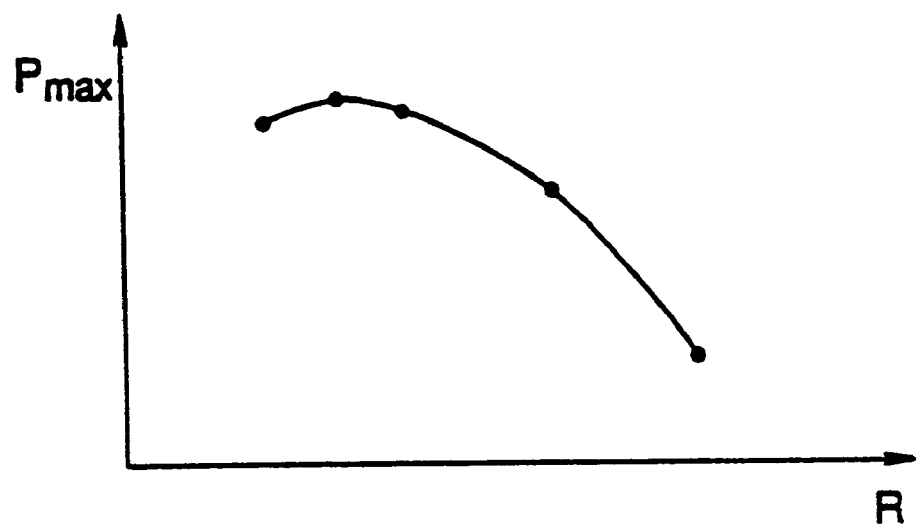
FIG. 35 is a graph showing the results of measurements of load resistance dependency and maximum output power $P_{max}$ according to the eighth embodiment of the invention.

Furthermore, as shown in FIG. 34, the I–V characteristics along the load line are measured by sweeping the values of load resistance R, whereby R dependency of the maximum output power $P_{max}$ and R dependencies of PAE and $P_{2dB}$ are measured and indicated as shown in FIG. 35.

In FIG. 34, Vd is in a range of 20 to 10 V, and Id is in a range of 20 A to several tens of mA. In FIG. 35, R is in a range of 0 to 500 Ω (or 1 kΩ), and $P_{max}$ is in a range of 0.1 to 100 W.

Consequently, according to the eighth embodiment of the invention, dependencies of $P_{max}$, PAE and $P_{2dB}$ on load resistance R, equivalent to those in actual operation, can be obtained without causing hysteresis, load dependency of a semiconductor element to be measured can be found without applying high-frequency signals, and high-frequency characteristics of the element can be determined at low cost and at high speed to characterize the element.

Embodiment 9

In a ninth embodiment of the present invention, a testing apparatus that can perform the testing methods according to the seventh and eighth embodiments of the invention is obtained with software in which the testing methods according to the seventh and eighth embodiments are programmed.

An apparatus as shown in FIG. 16 can be exemplified as hardware. In this apparatus, the respective processes as previously described are carried out with software, whereby element characteristics equivalent to those in actual operation are easily measured with low-frequency pulses at low cost, at high speed and with high precision, without causing hysteresis.

Embodiment 10

Using the hardware shown in FIG. 16, a burn-in apparatus performing burn-in of a semiconductor element by applying pulses as shown in FIGS. 22 to 26, a burn-in method may be performed, whereby an apparatus for testing and burning-in a semiconductor element is provided, and a semiconductor that has been burned-in is obtained at low cost.

Generally, in a semiconductor device, various levels (traps) due to impurities and lattice stress are present. Therefore, when a current flows for a long time, the levels increase and decrease, so that element characteristics vary. For this reason, there is employed a burn-in method in which a current is sent in advance to apply electric field stress in order to prevent variations of the element characteristics. Because much time is spent in simply sending DC to a high-frequency element, there is employed an RF burn-in method in which high-frequency signals (continuous wave) are applied in order to prevent the aforesaid variation. However, an apparatus to which high-frequency signals are applied is generally expensive, causing a cost increase in a semiconductor device. Therefore, in place of the high-frequency signals, low-frequency pulses as shown in FIGS. 22 to 26 are applied, whereby burn-in is performed at low cost.

Since the time constants of the respective levels are longer than several hundreds of nsec, as described above, by applying the low-frequency pulses, an electric field stress equivalent to that in the case of applying high-frequency signals can be applied, so that the same effects as if the high-frequency signals were applied are obtained. As a result, burn-in is performed with an apparatus for testing a semiconductor element at lower cost than in the prior art RF burn-in, thereby preventing the burn-in cost from increasing the cost of a semiconductor device, leading to a cost decrease.

What is claimed is:

1. A method of testing a semiconductor element including:

applying pulsed voltages synchronized with each other to a gate and to a drain, respectively, of a semiconductor element;

measuring a current flowing through the semiconductor element in response to the pulsed voltages; and detecting a variation of a drain current flowing through the drain in response to a varying voltage applied to the gate of the semiconductor element, thereby measuring transconductance gm along a load line.

2. A method of testing a semiconductor element including:

applying pulsed voltages synchronized with each other to a gate and to a drain, respectively, of a semiconductor element;

measuring a current flowing through the semiconductor element in response to the pulsed voltages; and detecting a variation of a drain current flowing through the drain in response to a varying voltage applied to the gate of the semiconductor element, thereby measuring frequency dispersion of transconductance gm along a load line.

3. A method of testing a semiconductor element including:

applying pulsed voltages synchronized with each other to a gate and to a drain, respectively, of a semiconductor element;

measuring a current flowing through the semiconductor element in response to the pulsed voltages; and detecting a variation of a drain current flowing through the drain in response to a varying voltage applied to the drain of the semiconductor element, thereby measuring drain conductance gd along a load line.

4. A method of testing a semiconductor element including:
applying pulsed voltages synchronized with each other to a gate and to a drain, respectively, of a semiconductor element;
measuring a current flowing through the semiconductor element in response to the pulsed voltages; and
detecting a variation of a drain current flowing through the drain in response to a varying voltage applied to the drain of the semiconductor element, thereby measuring frequency dispersion of drain conductance gd along a load line.

5. A method of testing a semiconductor element including:
preparing a semiconductor element having a source, a gate, and a drain by connecting a load to the drain;
applying pulsed voltages synchronized with each other to the gate and to the drain, respectively, of the semiconductor element;
measuring a current flowing through the semiconductor element in response to the pulsed voltages; and
applying pulsed voltages having positive pulses and negative pulses that are alternately repeated at regular intervals.

6. A method of testing a semiconductor element including:
preparing a semiconductor element having a source, a gate, and drain by connecting a load to the drain;
applying pulsed voltages synchronized with each other to the gate and to the drain, respectively, of the semiconductor element;
measuring a current flowing through the semiconductor element in response to the pulsed voltages; and
applying pulsed voltages having positive pulses and negative pulses that are alternatingly repeated.

7. A method of testing a semiconductor element including:
preparing a semiconductor element having a source, a gate, and a drain by connecting a load to the drain;
applying pulsed voltages synchronized with each other to the gate and to the drain, respectively, of the semiconductor element;
measuring a current flowing through the semiconductor element in response to the pulsed voltages; and
applying a pulse for discharging an electronic charge immediately before applying the pulsed voltages for measurement.

8. A method of testing a semiconductor element including:
preparing a semiconductor element having a source, a gate, and a drain by connecting a load to the drain;
applying pulsed voltages synchronized with each other to the gate and to the drain, respectively, of the semiconductor element;
measuring a current flowing through the semiconductor element in response to the pulsed voltages; and
applying pulsed voltages having positive pulses and negative pulses produced immediately after respective positive pulses n (n≧1) times, the pulses being repeated at regular intervals.

9. The method of claim 8 including calculating drain conductance gd along a load line by sweeping a drain voltage Vd with a gate voltage Vg at respective points of the load line.

10. The method of claim 8 further including calculating transconductance gm along a load line by sweeping a gate voltage Vg with a drain voltage Vd at respective points of the load line.

11. The method of claim 8 including measuring I–V characteristics of the semiconductor element along a load line, using the pulsed voltages synchronized with each other.

12. The method of claim 8 further including calculating resistance dependency of the maximum output power $P_{max}$ by sweeping resistance R of the load line and repeating measurement of I–V characteristics along the load line.

* * * * *